US012765403B2

(12) United States Patent
Zeng et al.

(10) Patent No.: US 12,765,403 B2
(45) Date of Patent: Oct. 13, 2026

(54) INTEGRATED PACKAGE DEVICE, FABRICATION METHOD THEREOF AND MEMORY SYSTEM

(71) Applicant: YANGTZE MEMORY TECHNOLOGIES CO., LTD., Wuhan (CN)

(72) Inventors: Xinru Zeng, Wuhan (CN); Peng Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 461 days.

(21) Appl. No.: 18/227,266

(22) Filed: Jul. 27, 2023

(65) Prior Publication Data

US 2024/0332152 A1 Oct. 3, 2024

Related U.S. Application Data

(63) Continuation of application No. PCT/CN2023/086020, filed on Apr. 3, 2023.

(51) Int. Cl.
*H10W 70/63* (2026.01)
*H10W 72/90* (2026.01)
(Continued)

(52) U.S. Cl.
CPC ......... *H10W 70/635* (2026.01); *H10W 72/90* (2026.01); *H10W 74/019* (2026.01);
(Continued)

(58) Field of Classification Search
CPC . H10W 70/635; H10W 72/90; H10W 74/019; H10W 74/117
See application file for complete search history.

(56) References Cited

U.S. PATENT DOCUMENTS 6,451,624 B1 * 9/2002 Farnworth ............ H10W 90/00 438/106
7,344,917 B2 * 3/2008 Gautham ............ H10W 70/095 438/106
(Continued)

FOREIGN PATENT DOCUMENTS

CN 103296014 A * 9/2013 ............ H10W 70/60
CN 111066144 A * 4/2020 .......... H10W 74/121
(Continued)

OTHER PUBLICATIONS

Supplementary Partial European Search Report issued in corresponding European Application No. 23923201.0, mailed on Aug. 26, 2025, 22 pages.

*Primary Examiner* — Laura M Menz
(74) *Attorney, Agent, or Firm* — BAYES PLLC

(57) ABSTRACT

The present application provides an integrated package device, a method of fabricating an integrated package device, and a memory system. The integrated package device may include at least one package module. Each package module may include a first sub-package module with a first electronic devices. Each package module may include a second sub-package module including a second electronic devices. Each package module may include a first re-distribution layer connected with first pads. Each package module may include a second re-distribution layer connected with second pads.

17 Claims, 14 Drawing Sheets

(51) Int. Cl.

| | |
|---|---|
| ***H10W 74/01*** | (2026.01) |
| ***H10W 74/10*** | (2026.01) |
| ***H10W 90/00*** | (2026.01) |
| *H10W 74/00* | (2026.01) |
| *H10W 90/20* | (2026.01) |

(52) U.S. Cl.

CPC .......... *H10W 74/117* (2026.01); *H10W 90/00* (2026.01); *H10W 74/00* (2026.01); *H10W 90/297* (2026.01); *H10W 90/701* (2026.01); *H10W 90/732* (2026.01); *H10W 90/734* (2026.01); *H10W 90/794* (2026.01)

(56) References Cited

U.S. PATENT DOCUMENTS

| | | | | | |
|---|---|---|---|---|---|
| 7,768,795 | B2 * | 8/2010 | Sakurai | H10W 90/00 | 361/795 |
| 7,781,877 | B2 * | 8/2010 | Jiang | H10W 74/014 | 438/118 |
| 9,257,419 | B2 * | 2/2016 | Yap | H10W 70/424 | |
| 9,601,471 | B2 * | 3/2017 | Zhai | H10W 90/00 | |
| 10,453,821 | B2 * | 10/2019 | Lee | H10W 70/614 | |
| 10,546,830 | B2 | 1/2020 | Jeng et al. | | |
| 10,593,653 | B2 * | 3/2020 | Jiang | H10W 74/014 | |
| 11,594,525 | B2 * | 2/2023 | Jiang | H10W 74/014 | |
| 11,699,682 | B2 * | 7/2023 | Lu | H10W 70/614 | 257/774 |
| 11,721,614 | B2 * | 8/2023 | Derai | H10W 70/09 | 257/668 |
| 2004/0178495 | A1 * | 9/2004 | Yean | H10W 70/093 | 438/109 |
| 2007/0122940 | A1 * | 5/2007 | Gautham | H10W 70/095 | 438/106 |
| 2009/0039523 | A1 * | 2/2009 | Jiang | H10W 74/014 | 257/777 |
| 2015/0108661 | A1 * | 4/2015 | Vincent | H10P 54/00 | 257/777 |
| 2015/0262981 | A1 * | 9/2015 | Yap | H10W 70/424 | 29/830 |
| 2015/0325554 | A1 * | 11/2015 | Jiang | H10W 74/014 | 438/109 |
| 2015/0364448 | A1 * | 12/2015 | Huang | H10W 70/614 | 257/659 |
| 2016/0315071 | A1 * | 10/2016 | Zhai | H10W 90/00 | |
| 2017/0207204 | A1 * | 7/2017 | Lin | H10W 90/00 | |
| 2019/0006309 | A1 * | 1/2019 | Jeng | H10W 70/60 | |
| 2019/0043835 | A1 * | 2/2019 | Lee | H10W 70/614 | |
| 2019/0326223 | A1 * | 10/2019 | Lee | H10W 70/09 | |
| 2019/0385977 | A1 * | 12/2019 | Elsherbini | H10W 90/00 | |
| 2021/0407919 | A1 * | 12/2021 | Patil | H10P 72/74 | |
| 2022/0189901 | A1 * | 6/2022 | Gu | H10W 70/09 | |
| 2024/0213130 | A1 * | 6/2024 | Doi | H10W 70/685 | |
| 2024/0332152 | A1 * | 10/2024 | Zeng | H10W 70/635 | |
| 2026/0026013 | A1 * | 1/2026 | Shen | H10B 80/00 | |

FOREIGN PATENT DOCUMENTS

| | | | | | |
|---|---|---|---|---|---|
| CN | 111902933 | A | | 11/2020 | |
| CN | 119072782 | A | * | 12/2024 | H10W 90/00 |
| EP | 4181191 | A2 | | 5/2023 | |
| EP | 4471852 | A1 | * | 12/2024 | H10W 90/00 |
| JP | 2007005832 | A | | 1/2007 | |
| JP | 2018514088 | A | | 5/2018 | |
| JP | 2019009444 | A | | 1/2019 | |
| JP | 2019033245 | A | | 2/2019 | |
| JP | 2021526309 | A | | 9/2021 | |
| JP | 2024504487 | A | | 1/2024 | |
| JP | 7455951 | B2 | * | 3/2024 | H10W 74/121 |
| JP | 2024090149 | A | | 7/2024 | |
| JP | 7715143 | B2 | * | 7/2025 | H10W 90/00 |
| KR | 100914977 | B1 | * | 9/2009 | H01L 25/105 |
| KR | 20210010431 | A | | 1/2021 | |
| KR | 102434988 | B1 | * | 8/2022 | H01L 24/27 |
| KR | 20240149904 | A | * | 10/2024 | H10W 90/00 |
| TW | I553807 | B | * | 10/2016 | H10W 42/276 |
| WO | WO-2006027981 | A1 | * | 3/2006 | G11C 5/04 |
| WO | WO-2009045626 | A1 | * | 4/2009 | H10W 90/00 |
| WO | WO-2013127035 | A1 | * | 9/2013 | H10W 90/00 |
| WO | WO-2014196105 | A1 | * | 12/2014 | H10W 99/00 |
| WO | 2019240901 | A1 | | 12/2019 | |
| WO | WO-2020123001 | A1 | * | 6/2020 | H10W 70/614 |
| WO | WO-2021133826 | A1 | * | 7/2021 | H10W 90/00 |
| WO | WO-2024207156 | A1 | * | 10/2024 | H10W 90/00 |
| WO | WO-2025212336 | A1 | * | 10/2025 | H10W 90/00 |
| WO | WO-2026019724 | A1 | * | 1/2026 | H10B 80/00 |

* cited by examiner

INTEGRATED PACKAGE DEVICE, FABRICATION METHOD THEREOF AND MEMORY SYSTEM

CROSS-REFERENCE TO RELATED APPLICATIONS

This application is a continuation of International Application No. PCT/CN2023/086020, filed on Apr. 3, 2023, which is incorporated herein by reference in its entirety.

TECHNICAL FIELD

The present application relates to the field of semiconductor technologies, and in particular to an integrated package device, a fabrication method thereof and a memory system.

BACKGROUND

With the development of chip technologies, various packaging techniques have been proposed, among which an existing packaging technique using chip stacking includes wiring and TSV processes. However, the wiring process may enlarge the footprint of the whole package due to the existence of bonding fingers, and the TSV process requires matching between chip designs and chip packaging, is difficult technically and has a relatively high cost. In recent years, fan-out packages have emerged and are expected to drive the development of chip stack packaging. However, in known fan-out package structures, there are problems in system structure of poor assembling efficiency and manner as well as poor physical protection.

SUMMARY

An implementation of the present application provides an integrated package device, a method of fabricating the same and a memory system that improve packaging efficiency and the quantity of fabricated devices, while at the same time providing efficient heat conduction and magnetic shielding.

In an aspect, an implementation of the present application provides an integrated package device including at least one package module. Each package module may include a first sub-package module including a plurality of first electronic devices and a molding body encapsulating the plurality of first electronic devices, each of first electronic devices including a first pad on a side thereof. Each package module may include a second sub-package module stacked on the side of the first sub-package module away from the first pad and including a plurality of second electronic devices and a second molding body encapsulating the plurality of second electronic devices, each of the second electronic devices including a second pad on a side thereof. Each package module may include a first re-distribution layer located on the side of the first sub-package module away from the second sub-package module and connected with each of the first pads. Each package module may include a second re-distribution layer located on the side of the second sub-package module away from the first sub-package module and connected with each of the second pads.

Optionally, the package module may further include a through-molding via (TMV) extending through the first molding body and the second molding body and connecting the first re-distribution layer and the second re-distribution layer.

Optionally, the integrated package device may further include a first bonding structure and a second bonding structure that are located on the first sub-package module and the second sub-package module respectively and are sandwiched therebetween, the first bonding structure and the second bonding structure bonding the first sub-package module and the second sub-package module together.

Optionally, the integrated package device may further include an external connection structure located on the side of the second re-distribution layer away from the second sub-package module and connected with the second re-distribution layer.

Optionally, the external connection structure may include tin ball array.

Optionally, the integrated package device may further include a protecting layer covering the side of the first re-distribution layer away from the first sub-package module.

Optionally, the integrated package device may further include an adhesive layer between the first sub-package module and the second sub-package module.

Optionally, the plurality of first electronic devices and/or the plurality of second electronic devices may be stacked, in staircase, respectively in the direction in which the first sub-package module and the second sub-package module are stacked, and the first pad of each of the first electronic devices and/or the second pad of each of the second electronic devices may not covered by any other first electronic device and/or any other second electronic device.

Optionally, the outer connecting surfaces of the first pads and the outer connecting surfaces of the second pads may face the first re-distribution layer and the second re-distribution layer respectively, and the first sub-package module and/or the second sub-package module further include first conductive pillars and/or second conductive pillars respectively, which electrically connect the first re-distribution layer with part of the first pads and/or the second redistribution layer with part of the second pads respectively.

Optionally, the outer connecting surfaces of the first pads may face away from the first re-distribution layer or the outer connecting surfaces of the second pads face away from the second re-distribution layer, and the package module further includes gold wires, through which the first pads are connected with the first re-distribution layer or the second pads are connected with the second re-distribution layer.

Optionally, the plurality of first electronic devices and the plurality of second electronic devices may be arranged respectively in at least two columns in the lateral direction perpendicular to the direction in which the first sub-package module and the second sub-package module are stacked; and the TMV is located on the outer side of one column of electronic devices away from the other column, and there is at least one TMV.

Optionally, the plurality of first electronic devices and the plurality of second electronic devices may be arranged respectively in at least two columns in the lateral direction perpendicular to the direction in which the first sub-package module and the second sub-package module are stacked; and the TMV is located between the two columns of electronic devices, and there is at least one TMV.

Optionally, the integrated package device may further include a plurality of the package module, wherein the plurality of package modules are stacked in the direction in which the first sub-package module and the second sub-package module are stacked. In some implementations, the external connection structure on one of any two adjacent package modules may be connected with the first re-distribution layer of the other of the two adjacent package modules. In some implementations, the integrated package device may further include a protecting layer covering the first re-distribution layer of the package module outermost in the vertical direction.

Optionally, the package module may further include an external connection structure that is located on the side of the second re-distribution layer away from the second electronic devices and connected with the second re-distribution layer. In some implementations, the integrated package device may further include a plurality of the package module that are stacked in the direction in which the first sub-package module and the second sub-package module are stacked. In some implementations, the external connection structure on one of any two adjacent package modules may be connected with the first re-distribution layer of the other of the two adjacent package modules. In some implementations, the integrated package device may further include a protecting layer covering the first re-distribution layer of the package module outermost in the vertical direction. In some implementations, the TMVs in the plurality of package modules may be aligned or misaligned in the vertical direction.

In another aspect, an implementation of the present application also provides a method of fabricating an integrated package device. The method may include providing a first sub-package module and a second sub-package module. In some implementations, the first sub-package module may include a plurality of first electronic devices and a first molding body encapsulating the plurality of first electronic devices. In some implementations, each of the first electronic devices may include a first pad on a side thereof. In some implementations, the second sub-package module may be on the side of the first sub-package module away from the first pad. In some implementations, the second sub-package may include a plurality of second electronic devices and a second molding body encapsulating the plurality of second electronic devices, each of the second electronic devices including a second pad on a side thereof. The method may include stacking the first sub-package module and the second sub-package module. The method may include forming a first re-distribution layer located on the side of the first sub-package module away from the second sub-package module and connected with the first pads. The method may include forming a second re-distribution layer located on the side of the second sub-package module away from the first sub-package module and connected with the second pads.

Optionally, the forming the second re-distribution layer connected with the second pads may further includes forming a through-molding via (TMV) that extends through the first molding body and the second molding body and connects the first re-distribution layer and the second re-distribution layer. In some implementations, the second re-distribution layer may be connected with the TMV.

Optionally, the method may further include forming an external connection structure that is on the side of the second re-distribution layer away from the second sub-package module and connected with the second re-distribution layer.

Optionally, the providing the first sub-package module and the second sub-package module may include arranging the plurality of first electronic devices and the plurality of second electronic devices on a first temporary adhesive layer and a second temporary adhesive layer respectively with the outer connecting surfaces of the first pads of the first electronic devices facing respectively one and the same side as the outer connecting surfaces of the second pads of the second electronic devices facing one and the same side. Optionally, the providing the first sub-package module and the second sub-package module may include disposing a first carrier and a second carrier on the side of the plurality of first electronic devices and the side of the plurality of second electronic devices away from the first temporary adhesive layer and the second temporary adhesive layer respectively, the first carrier and the second carrier having temporary bonding films facing the plurality of first electronic devices and the plurality of second electronic devices respectively, and the outer connecting surfaces of the first pads and the outer connecting surfaces of the second pads facing the first carrier and the second carrier or facing away from the first carrier and the second carrier respectively. Optionally, the providing the first sub-package module and the second sub-package module may include removing the first temporary adhesive layer and the second temporary adhesive layer and forming the first molding body and the second molding body on the first carrier and the second carrier respectively.

Optionally, the method may further include, before disposing the first carrier and the second carrier, disposing first conductive pillars and second conductive pillars on part of the first pads and part of the second pads respectively.

Optionally, the stacking the first sub-package module and the second sub-package module may further include disposing an adhesive layer between the first sub-package module and the second sub-package module.

Optionally, the stacking the first sub-package module and the second sub-package module may further include disposing a first bonding structure and a second bonding structure on the first sub-package module and the second sub-package module respectively.

Optionally, the method may further include forming a protecting layer on the side of the first re-distribution layer away from the first sub-package module to cover the first re-distribution layer.

Optionally, the method may further include, during stacking of the first sub-package module and the second sub-package module, placing the side of the first sub-package module and the side of the second sub-package module away from the first carrier and the second carrier respectively close to each other with the first carrier and the second carrier located on the two outer sides of the combination of the first sub-package module and the second sub-package module. Optionally, the method may further include removing the first carrier and the second carrier before forming the first re-distribution layer and the second re-distribution layer.

Optionally, the method may further include providing a plurality of package modules; stacking the plurality of package modules in the direction in which the first sub-package module and the second sub-package module are stacked. Optionally, the method may further include connecting the external connection structure on one of any two adjacent package modules with the first re-distribution layer of the other of the two adjacent package modules.

Optionally, the stacking the plurality of package modules in the direction in which the first sub-package module and the second sub-package module are stacked, may further include forming a protecting layer covering the first re-distribution layer of the package module outermost in the vertical direction.

In yet another aspect, an implementation of the present application provides a memory system, the memory system including any one of the integrated package devices described above. In some implementations, at least one of the first electronic devices and/or at least one of the second electronic devices in the integrated package device include/includes a memory device and at least any other one of the first electronic devices and/or at least any other one of the second electronic devices include/includes a controller used to control operations of the memory device.

Using the integrated package device, the method of fabricating an integrated package device and the memory system disclosed by implementations of the present application, not only a high number of semiconductor dies or electronic devices can be accommodated, but also the packaging density can be increased by taking vertical stack packaging scheme. Meanwhile, the package body can have a system structure with electromagnetic shielding and the whole package body can have a relatively high proportion of metal. Still further, the dies may be disposed back-to-back and have thermally conductive adhesive films/bonding films therebetween, so that the whole structure has beneficial heat dissipation. By utilizing re-distribution layers (RDLs) instead of conventional gold wiring, the overall wiring pitch may be reduced, the transmission speed of signals can be increased, the high-frequency performance may be improved, and a substantially complete function may be realized to achieve a system in package (SiP). Furthermore, using the modular packaging solution disclosed by implementations of the present application, a high stack structure can be achieved, the difficulty of processing ultra-thin chips for a high stack package having a high capacity may be reduced to facilitate mass production and packages of different capacities may be processed flexibly due to the infinite possibilities of stacking. In this way, the market demands can be met and the processing yield of packages can be beneficially improved.

BRIEF DESCRIPTION OF THE DRAWINGS

In order to illustrate the technical solutions in implementations or in the prior art more clearly, drawings needed in the description of the implementations or the prior art will be briefly introduced. Apparently, drawings in the following description represent only some implementations of the present application and, in light of them, other drawings can be figured out by those of ordinary skills in the art without any creative works.

FIG. 2*d* is a cross-sectional structure block diagram of an integrated package device as a memory system.

DETAILED DESCRIPTION

Figure 1A:
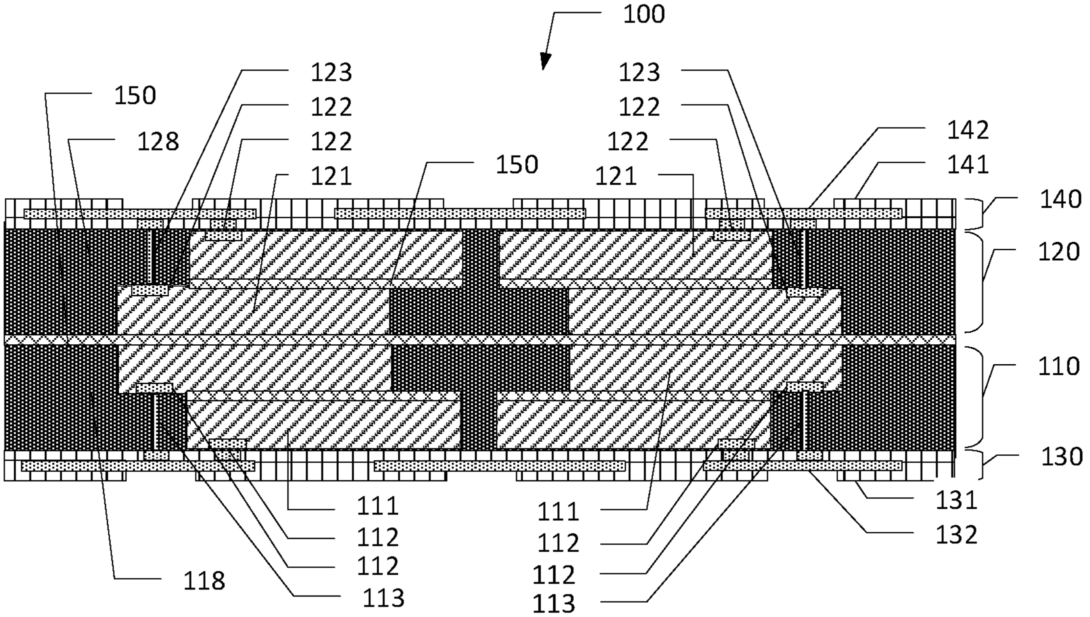
FIGS. 1*a*-1*f* are cross-sectional structure diagrams of various package modules in an integrated package device provided by implementations of the present application.

Example implementations of the present disclosure will be described in more detail below with reference to the accompanying drawings. Although example implementations of the present disclosure are shown in the drawings, it should be understood that the present disclosure may be implemented in various forms and should not be limited to the specific implementations set forth herein. Rather, these implementations are provided so that the present disclosure can be more thoroughly understood and the scope of the present disclosure can be fully conveyed to those skilled in the art. Specific details of structures and functions disclosed herein are only representative and used for the purpose of describing exemplary implementations of the present application. However, the present application may be specifically implemented in many alternative forms and should not be construed to be limited by the implementations described herein.

In the description of the present application, it is understood that orientation and position relationships indicated by terms "center", "lateral", "upper", "lower", "left", "right", "vertical", "horizontal", "top", "bottom", "inner", "outer" and the like are those based on the drawings and only for the purpose of describing and simplifying the description. There is no indication or implication that the devices or elements referred to must have any particular orientations and positions, or be constructed or operated in any particular orientations and positions. As a result, they should not be understood as limitation for the present application. Moreover, the terms "first", "second" etc. are only used for the purpose of description and should not be understood to indicate or imply relative importance or to designate the number of the referenced technical features implicitly. Therefore, a feature qualified by "first" or "second" may include one or more instances of the feature explicitly or implicitly. In the description of the present application, "a plurality of" means two or more unless otherwise specified. Moreover, the term "include", "comprise" and variations thereof are intended to cover the meaning of "include or comprise non-exclusively".

Furthermore, when the same type of devices are qualified by the terms "first" and "second", it is only intended to distinguish different devices of the same type and express relative positions instead of any sequence or constancy. That is to say, the terms "first" and "second" are exchangeable and any one of the same type of devices that is referred to as "first" may also be referred to as "second".

In the description of the present application, it is to be noted that terms "interconnect" and "connect" should be explained broadly. They may include, for example, fixed connection, removable connection or integral connection; mechanical connection or electrical connection; direct interconnection or interconnection with intermediate medium; or inner communication of two elements, unless otherwise specified or limited expressly. The specific meaning of the above-mentioned terms in the present application will be understood by those of ordinary skill in the art depending on specific circumstances.

Terms used herein are only for the purpose of describing specific implementations without any intention of limiting them. Singular forms used herein such as "a" and "an" are also intended to include plural forms, unless otherwise noted expressly in the context. It is also understood that terms "include" and/or "comprise" used herein designate existence of the stated features, integers, steps, operations, elements and/or assemblies without excluding existence or addition of one or more other features, integers, steps, operations, elements, assemblies and/or any combination thereof.

Fan-out wafer level packaging (FOWLP) is a new method of integrating a plurality of dies obtained from heterogeneous fabrication processes into one compact package. Due to the demands for apparatuses with a low profile and a higher number of inputs/outputs, fan-out wafer level packages are drawing increasing attention. With the development of FOWLP, single-chip applications have evolved into multi-chip package (MCP) applications, 3D package-on-package (POP) applications, and the like to achieve a higher level of integration of I/O chips.

FOWLP makes full use of RDLs for connection so as to maximize interconnection density. Conventional WLP packages are usually in Fan-in configurations and used for integrated circuits (ICs) with a low number of pins. When the area of a chip decreases, the number of pins that can be accommodated by the chip also decrease, and as the result FOWLP packages in a spreading configurations have been developed to utilize RDLs fully for making connections outside the chip, increasing the number of pins. When each die is embedded in an epoxy molding compound (EMC), the gaps between dies each has an additional input/output (I/O) connecting point so as to increase the I/O number, improve silicon utilization, maximize interconnection density, and achieve high-bandwidth transmissions of data.

FOWLP can lower package cost and package thickness. In contrast to fan-in packaging techniques, FOWLP has the advantages of reduced package thickness, scalability (increased I/O number), improved electrical and thermal performance, and processes without any base plate. Fan-out WLP is similar to conventional ball grid array (BGA) packaging in structure, but needs no expensive substrate process.

Based on the demands for versatile and miniaturized system products, integrated circuit packages enter an era of 3D stacking packages. The era of 3D stacking packages is characterized by: (1) evolvement from package assemblies to package systems, (2) development from single-chip applications to multiple-chip applications, and (3) development from in-plane packages (MCM) to 3D packages. However, until now there are no effective and efficient package designs that enable simple operations of 3D packaging and adapt to various combinations, especially in designing of memory chips and memory systems. Therefore, the present application utilizes chip-size packages (CSPs) and a build-up multilayer base plates technique in combination with flip connection, connection through vias, Package on Package (POP) techniques and the like, as well as an ingenious design to provide an integrated package device that provides convenience and adapts to various system packages, especially those including memories. The integrated package device can integrate chips of various functions, including a processor, a memory, or any other functional chips, into one package to realize a substantially complete function and form a system-in-package (SiP).

Hereafter, in some implementations, the integrated package device, the fabrication method thereof and the memory system provided by the present application will be illustrated.

As shown in FIGS. 1*a*-1*f*, an integrated package device, especially the package modules that can facilitate stack packaging and in turn formation of the integrated package device, in accordance with some implementations of the present application is illustrated.

First of all, the integrated package device in accordance with some implementations of the present application can be a basic one. As shown in FIG. 1*a*, the integrated package device illustrated in an implementation of the present application includes at least one package module 100. The package module 100 may include a first sub-package module 110, a second sub-package module 120, a first re-distribution layer 130 and a second re-distribution layer 140. The first sub-package module 110 may include a plurality of first electronic devices 111 and a first molding body 118 encapsulating the plurality of first electronic devices. Each of the first electronic devices 111 may include a first pad 112 on a side thereof. The second sub-package module 120 may be stacked on the side of the first sub-package module 110 away from the first pads 112. The second sub-package module 120 may include a plurality of second electronic devices 121 and a second molding body 128 that encapsulates the plurality of second electronic devices. Each of the second electronic devices 121 including a second pad 122 on a side thereof. The first re-distribution layer 130 is on the side of the first sub-package module 110 away from the second sub-package module 120 and connected with the first pads 112. The second re-distribution layer 140 is on the side of the second sub-package module 120 away from the first sub-package module 110 and connected with the second pads 122.

In some implementations, the first electronic devices 111 and the second electronic devices 121 may include any active devices or passive components and can be collectively referred to as the first or second electronic devices, respectively. Common passive components are mainly resistors, inductors, capacitors and the like, characterized by the capability of operating without any power source in a circuit when signals are present. Common passive components can be classified into a circuit type and a connection type, according to their functions in a circuit. Therefore, the first electronic devices 111 and/or the second electronic devices 121 may include, for example, diodes, resistors, resistor networks, capacitors, inductors, transformers, relays, keys, beepers, speakers, switches, or any other devices of the circuit type.

Active devices are main devices of an electronic circuit and can be classified into various types of discrete devices and integrated circuits, according to their physical structures, circuit functions, and engineering parameters. Therefore, the first electronic devices 111 and/or the second electronic devices 121 may include, for example, discrete devices such as bipolar transistors (BJTs), field effective transistors, thyristors and semiconductor resistors and capacitors (those fabricated by integration processes and used in integrated circuits). The first electronic devices 111 and/or the second electronic devices 121 may include analog integrated circuit devices, e.g., such as integrated operation amplifiers, comparators, logarithmic amplifiers and exponential amplifiers, analog multipliers/dividers, analog switches, phase lock loops (PLLs), voltage regulators, reference sources, wave-form generators, power amplifiers, power management circuits and the like. The first electronic devices 111 and/or the second electronic devices 121 may include, e.g., digital integrated circuit devices such as basic logic gate circuits, flip-flops, registers, decoders, data comparators, drivers, counters, shaping circuits, PLDs, microprocessors (MPUs), microcontrollers (MCUs), digital signal processors (DSPs), and the like.

The plurality of first electronic devices 111 may be the same as or different from each other, and so may the plurality of second electronic devices 121. For example, as shown in the implementation of FIG. 1*a*, the first electronic devices 111 in the first sub-package module 110 may be the same as each other and so may the second electronic devices 121 in the second sub-package module 120. They can be, but not limited to, semiconductor chips with storage functions. Any type of chips can be chosen for the first electronic devices 111 and the second electronic devices 121, depending on the implementation.

Figure 1B:
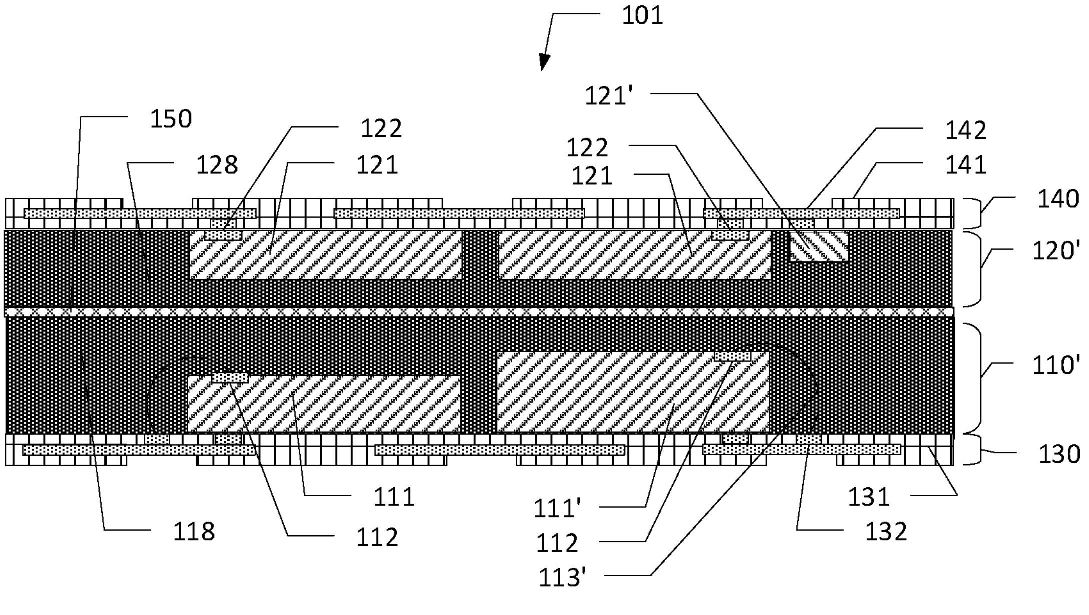

As an optional implementation of the combination of the first electronic devices 111 and the second electronic devices 121, FIG. 1*b* illustrates another example package module 101 of the integrated package device. The package module 101 may be different from the package module 100 in type, number, and/or arrangement of electronic devices. In the implementation shown in FIG. 1*b*, the first sub-package module 110' also includes a plurality of first electronic devices. However, the plurality of first electronic devices may include a first electronic device 111 and a first electronic device 111', which is different from the first electronic device 111. The first electronic device 111 may be, for example, a semiconductor memory chip/die such as a DRAM, a NAND, an NOR, an FeRAM, a RRAM or a PCRAM. On the other hand, the first electronic device 111' may be, for example, a controller, a power management circuit device, or the like. The second package module 120' may also include a plurality of second electronic devices. However, the plurality of second electronic devices may include a second electronic device 121 and a second electronic device 121', which is different from the second electronic device 121. The second electronic device 121 may be, for example, a semiconductor memory chip/die such as a NAND, an NOR, an FeRAM, a RRAM, a PCRAM or a DRAM. On the other hand, the second electronic device 121' may be, for example, a passive device such as an inductor or a semiconductor discrete device. Hereinafter, even though the first electronic devices 111/111' may be the same as or different from each other and so may the second electronic devices 121/121' as illustrated above, the first electronic devices 111 and the second electronic devices 121 may be taken as a representative to facilitate description.

In some implementations, both the first electronic devices 111 and the second electronic devices 121 may be electronic devices. Each electronic device may have a substrate and electronic components on the substrate. The electronic components may include 2D units, 3D memory units, and/or any other suitable components. As used herein, the term "3D memory unit" may refer to a semiconductor device having memory cell transistor strings (also referred to as "memory strings"), which extend in the direction perpendicular to the direction of chip thickness.

As also shown in FIG. 1*a*, each of the first electronic devices 111 has at least one first pad 112 on a side thereof and/or each of the second electronic devices 121 has at least one second pad 122 on a side thereof. The first pad 112 and the second pad 121 each act as a component of a signal transmitting path between the corresponding electronic device and an external device, e.g., such as a signal source or a power source. For ease of illustration, FIG. 1*a* shows that each first electronic device 111 has one first pad 112 and/or each second electronic device 121 has one second pad 122. However, each of the first electronic devices 111 may have a plurality of first pads 112 and/or each of the second electronic device s121 may have a plurality of second pads 122. Each first pad 112 and/or each second pad 122 may include at least one conductive material, such as, but not limited to, metal and/or a transparent conductive material.

Still referring to FIG. 1*a*, the first sub-package module 110 and the second sub-package module 120 may respectively include two columns of four first electronic devices 111 and second electronic devices 121 (only two first electronic devices are labeled) stacked sequentially in the longitudinal direction of the figure, and in the transverse direction perpendicular to the stacking direction in two columns on the left and right. In other words, the plurality of first electronic devices 111 and/or the plurality of second electronic devices 121 are stacked in a staircase configuration, respectively in the directions in which the first sub-package module 110 and/or the second sub-package module 120 are stacked. Here, the first pad 112 of each first electronic device 111 and/or the second pad 122 of each second electronic device 121 may not be covered by any other first electronic device 111 and/or any other second electronic device 121. However, the present application is not so limited. For example, when any two first/second electronic devices stacked one on top of the other are bonded and electrically connected through a bonding structure formed using a bonding adhesive layer, the two electronic devices may not be stacked in staircase (e.g., the staircase configuration) to misalign their first/second pads. For example, in the implementation shown in FIG. 1*b*, the first electronic devices 111 may be arranged in only one tier, and/or so may the second electronic devices 121. In this case, it may be unnecessary to take the stacking manner and design of mutual adhesion into account.

In the implementation of FIG. 1*a*, the plurality of first electronic devices 111 and/or second electronic devices 121 stacked on top of each other may be adhered to each other through die attachment films (DAFs) or thermally conductive adhesive films 150. In other words, the plurality of first electronic devices 111 and/or second electronic devices 121 may be joined through the adhesive layers, and may be bonded and electrically connected through the above-described bonding adhesive layers. The present application is not limited to such a configuration. Instead, in one non-limiting example, the die attachment films/thermally conductive adhesive films 150 may be disposed between opposite stacking surfaces of the first electronic devices 111 and/or the second electronic devices 121.

In some implementations, the first sub-package module 110 and the second sub-package module 120 may be adhered to each other through a DAF 150 or any other adhesive film. The first sub-package module 110 and the second sub-package module 120 may be joined through an adhesive layer, and may be bonded and electrically connected through the above-described bonding adhesive layer, in some non-limiting examples. The DAF 150 may be respectively disposed on the opposite stacking surfaces of the first sub-package module 110 and the second sub-package module 120.

As shown in FIG. 1*a*, the first sub-package module 110 and/or the second sub-package module 120 may also include vertical first conductive pillars 113 and/or second conductive pillars 123, respectively. The vertical first conductive pillars 113 and/or second conductive pillars 123 may electrically connect the first re-distribution layer 130 with part of the first pads 112 and/or the second redistribution layer 140 with part of the second pads 122, respectively. The first conductive pillars 113 and second conductive pillars 123 may include at least one conductive material, such as, but not limited to, gold, copper, aluminum, silver and/or any other suitable metal. Due to the use of the vertical conductive pillars, the lateral dimensions of the chip package structure 300 may be further reduced.

In some implementations, as shown in FIG. 1*b*, the conductive layer 132 or 142 in the first re-distribution layer 130 or the second re-distribution layer 140 may also be electrically connected with the first pads 112 or the second pads 122, respectively, through gold wires 113'.

In other words, the first re-distribution layer 130 and the second re-distribution layer 140 may be electrically connected with the first pads 112 of the first electronic devices 111 and the second pads 122 of the second electronic devices 121, respectively, through the conductive pillars or gold wires. As also shown in FIG. 1*a*, when the outer connecting surfaces of the first pads 112 and the outer connecting surfaces of the second pads 122 respectively face the first re-distribution layer 130 and the second re-distribution layer 140, the first sub-package module 110 and/or the second sub-package module 120 may include the first conductive pillars 113 and/or second conductive pillars 123, respectively. The first conductive pillars 113 and/or the second conductive pillars 123 may electrically connect the first re-distribution layer 130 with part of the first pads 112 and/or the second redistribution layer 140 with part of the second pads 122, respectively.

As shown in FIG. 1*b*, when the outer connecting surfaces of the first pads 112 are disposed to face away from the first re-distribution layer 130 or the outer connecting surfaces of the second pads 122 are disposed to face away from the second re-distribution layer 140, the first sub-package module 110 or the second sub-package module 120 in the package module 101 may include gold wires. The gold wires may connect the first pads 112 with the first re-distribution layer 130 or the second pads 122 with the second re-distribution layer 140.

As shown in FIGS. 1*a* and 1*b*, the first sub-package module 110/110' and the second sub-package module 120/120' may include the first molding body 118 and the second molding body 128, respectively. The first molding body 118 and the second molding body 128 may encapsulate the plurality of first electronic devices 111 and the plurality of second electronic devices 121 to respectively form the sub-package modules and expose the first pads 112 and the second pads 122, as well as the first conductive pillars 113 and the second conductive pillars 123 or the gold wires 113', respectively. The first molding body 118 and the second molding body 128 may protect the plurality of first electronic devices 111 and the plurality of second electronic devices 121 to respectively reduce their physical/chemical damages (such as those from oxidization and moisture). The first molding body 118 and the second molding body 121 may include, e.g., epoxy resin and/or any other suitable molding compound, including epoxy resin, phenolic resin, a catalytic agent, micro powder of silicon dioxide, or the like.

Still referring to FIGS. 1*a* and 1*b*, the first re-distribution layer 130 may be on the side of the first sub-package module 110/110' away from the second sub-package module 120/120' and connected with the first pads 112; and the second re-distribution layer 140 may be on the side of the second sub-package module 120/120' away from the first sub-package module 110/110' and connected with the second pads 122.

The first re-distribution layer 130 may include at least one conductive layer 132 and at least one insulating layer 131. Each conductive layer 132 may include, e.g., metal, any other suitable conductive material, or any combination thereof. Each insulating layer 131 may include an organic or inorganic material, e.g., such as silicon oxide, silicon nitride, silicon oxynitride, any other suitable insulating material, or any combination thereof. Likewise, the second re-distribution layer 140 may include at least one conductive layer 142 and at least one insulating layer 141. Each conductive layer 142 may include, e.g., metal, any other suitable conductive material, or any combination thereof. Each insulating layer 141 may include, for example, silicon oxide, silicon nitride, silicon oxynitride, any other suitable insulating material or any combination thereof. The number of the conductive layer(s) 132/142 and the number of the insulating layer(s) 131/141 in the first and second re-distribution layer 130 and 140 may be determined depending on practical designs. For ease of illustration, only one conductive layer 132/142 is shown, as one non-limiting example.

Referring again to FIG. 1*a*, the insulating layers 131 and 141 of the first and second re-distribution layers 130 and 140 each have a plurality of openings (not labeled) to expose a plurality of portions of the corresponding conductive layers 132 and 142 for external connection.

As a summary of the description above, it can be appreciated that the first electronic devices 111/111' in the first sub-package module 110/110' and the second electronic devices 121/121' in the second sub-package module 120/120' may include any type of electronic devices, and can be arranged and connected side-by-side or in stack. The connecting components between the electronic devices and the first re-distribution layer 130 or the second redistribution layer 140 may also be varied. Therefore, in some further implementations hereafter, for ease of description, the combination of the first electronic devices 111/111' in the first sub-package module 110/110' and the second electronic devices 121/121' in the sub-package module 120/120', and the connections between the electronic devices and the first re-distribution layer 130 or the second redistribution layer 140, will be described with reference to the combination in FIG. 1*a* that is taken as a non-limiting example.

Through the package module 100/101 described above, the main members of the package stack structure as the base of the integrated package device disclosed by an implementation of the present application are provided. That is, the package module of the present disclosure (e.g., an integrated package device) not only accommodates a high number of semiconductor dies or devices, but also increases packaging density by taking vertical stack packaging. Meanwhile, the package body may have a system structure with electromagnetic shielding, and the whole package body can have a relatively high proportion of metal. The dies may be disposed back-to-back and have thermally conductive films/bonding films therebetween. As a result, the whole structure has improved heat dissipation. By utilizing RDLs instead of conventional gold wiring, the overall wiring pitch may be reduced by 40% or more, the signal-transmission speed can be increased, the high-frequency performance may be improved, and a substantially complete function may be realized to achieve an SiP. Furthermore, circuit scalability can be enabled by electronic devices using the internal or external connection components of the package module. When such a package module is used to complete a high-stack structure in the modularized-packaging process described below, the difficulty of package processing ultra-thin chips for a high-stack package, which has a high capacity, may be reduced to facilitate mass production. Moreover, packages of different capacities may be flexibly processed due to the infinite possibilities of stacking to meet the market demands and beneficially improve the processing yield of packages.

Figure 1C:
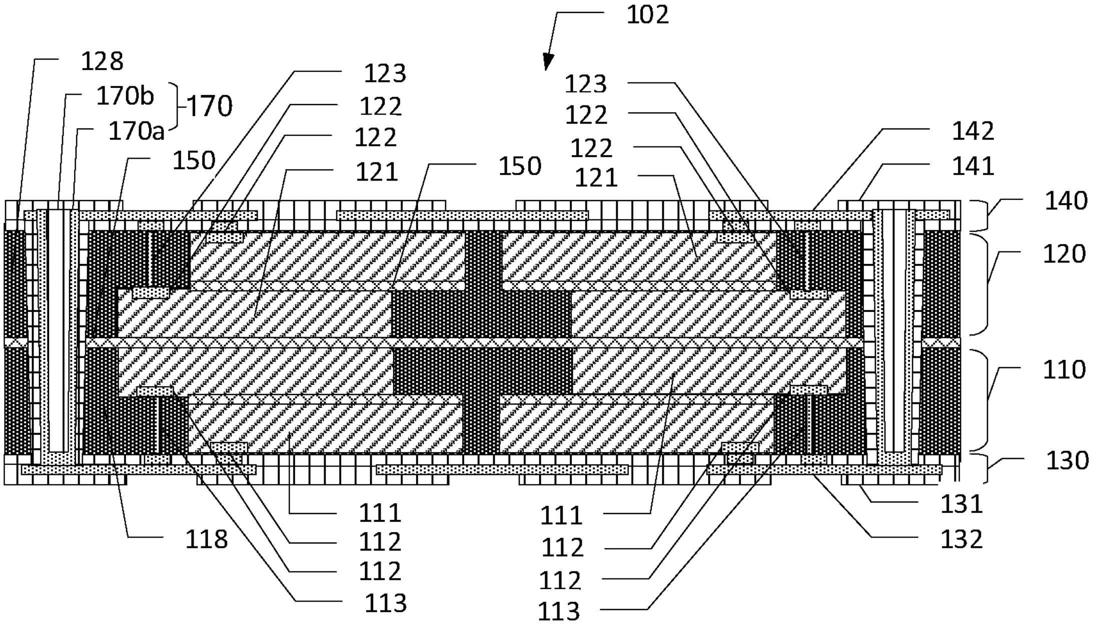
Figure 1D:
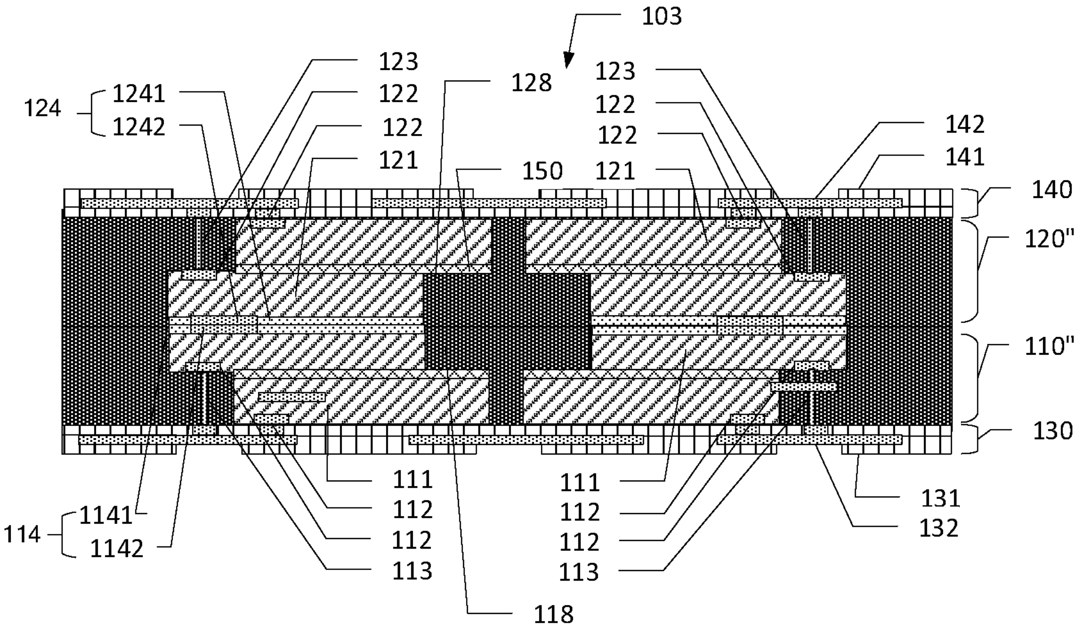

Hereafter, with further reference to FIGS. 1*c* and 1*d*, some other implementations will be disclosed in accordance with the present application.

As shown in FIG. 1*c*, the package module 102, as an integrated package device in accordance with an implementation of the present application, is based on the package module 100 as shown in FIG. 1*a* with through-molding vias (TMVs) 170 added. The same components in the package module 102 as those in the package module 100 will not be repeated here and only the difference between the two package modules will be explained. Still referring to FIG. 1*c*, each through-molding via 170 extends through the first molding body 118 and the second molding body 128, and connects the first re-distribution layer 130 and the second re-distribution layer 140. As also shown in FIG. 1*c*, a plurality of first electronic devices 111 and a plurality of second electronic devices 121 may be respectively arranged in at least two columns disposed in the lateral direction perpendicular to the direction in which the first sub-package module 110 and the second sub-package module 120 are stacked. Each through-molding via 170 may be disposed on the outer side of one column of electronic devices away from the other column, and there may be at least one through-molding via. However, in some implementations, as shown in FIG. 1*f*, each through-molding via 170 may be disposed between two columns of electronic devices and there may be at least one through-molding via 170.

In some implementations, each through-molding via 170 may include an insulating layer (not labeled) and a metal layer 170*a* formed on the inner sidewall of an opening through the first molding body 118. The second molding body 128 and an insulator 170*b* may be filled within the metal layer 170*a*. The metal layer 170*a* may connect the conductive layers 132 and 142 in the first re-distribution layer 130 and the second re-distribution layer 140 to electrically connect the first re-distribution layer 130 and the second re-distribution layer 140 outside the first sub-package module 110 and the second sub-package module 120, respectively. In this way, circuit connections may be diversified between electronic devices of the package module 102.

Using 3D-interconnection techniques, like the through-molding vias (TMVs) 170, in contrast to wire bonding, shorter interconnection paths, lower resistance and inductance, and more efficient transmissions of signals and power can be achieved, so that signal transmissions in the whole package module are improved or sped up, high-frequency performance of the product is improved, the number of the stacked dies is not limited, fabrication and design processes are not operation intensive, and fabrication costs may be reduced.

Furthermore, in accordance with some implementations of the present application, as shown in FIG. 1*d*, a package module 103 is illustrated as an integrated package device, which is similar to the package module 100 as shown in FIG. 1*a*. However, it is different in that, instead of using the DAF 150, a first bonding structure 114 and a second bonding structure 124 are included on the bonding surfaces of the electronic devices on the bonding side of the first sub-package module 110" and the bonding side of the second sub-package module 120" respectively, to bond the first sub-package module 110" and the second sub-package module 120" together and achieve circuit connections.

In some implementations, the first bonding structure 114 and the second bonding structure 124 may have the same structure and each have at least one bonding insulating layer 1141/1241 and at least one bonding contact 1142/1242 extending longitudinally through the bonding insulating layer 1141/1241. The bonding contacts 1142 and 1242 connect the circuit interconnection layers (not shown) in the first electronic devices 111 and the second electronic devices 121 to achieve mechanical and electrical connections between the first sub-package module 110" and the second sub-package module 120" in the package module 103 directly through the first bonding structure 114 and the second bonding structure 124. The material of each bonding insulating layer 1141/1241 may include, for example, silicon oxide, silicon nitride, silicon oxynitride, any other suitable insulating material, or any combination thereof. The material of each bonding contact 1142/1242 may include at least one conductive material, such as gold, copper, aluminum, silver and/or any other suitable metal, without limitation. Various bonding techniques may be used to facilitate the above-described structure.

By disposing the first bonding structure 114 and the second bonding structure 124 to replace the above-mentioned TMVs, the fabrication processes for the TMVs can be omitted. However, the bonding structures can be disposed in addition to the TMVs to achieve the function equivalent to that obtained by the above-mentioned TMVs 170. As previously mentioned, a plurality of first electronic devices 111 in the first sub-package module 110/110" or a plurality of second electronic devices 121 in the second sub-package module 120/120" may be mechanically and/or electrically connected through the above-mentioned bonding structures to achieve a conductive connection.

As another summary of the description above, in contrast to the package module 100/101, the above-described package module 102/103 has additional TMVs or bonding structures, and, thus, not only constitutes the main member of the package stack structure as the base of an integrated package device but also provides more possibilities of circuit connection for flexibility of application. In this way, combinations of package modules can be used more flexibly in any subsequent package-stack structure.

Figure 1E:
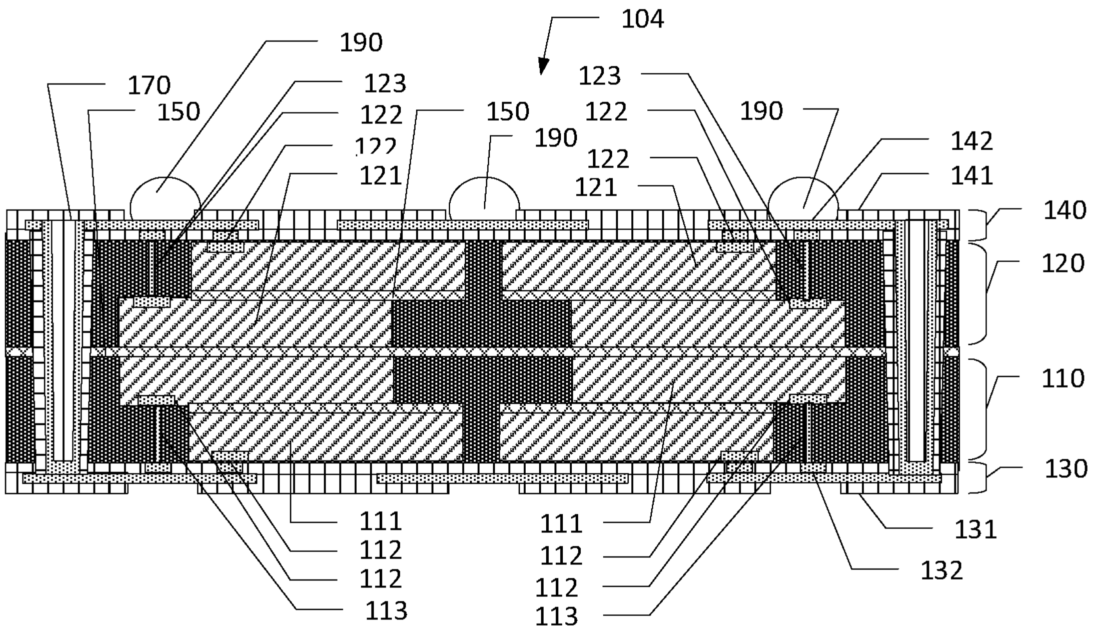
Figure 1F:
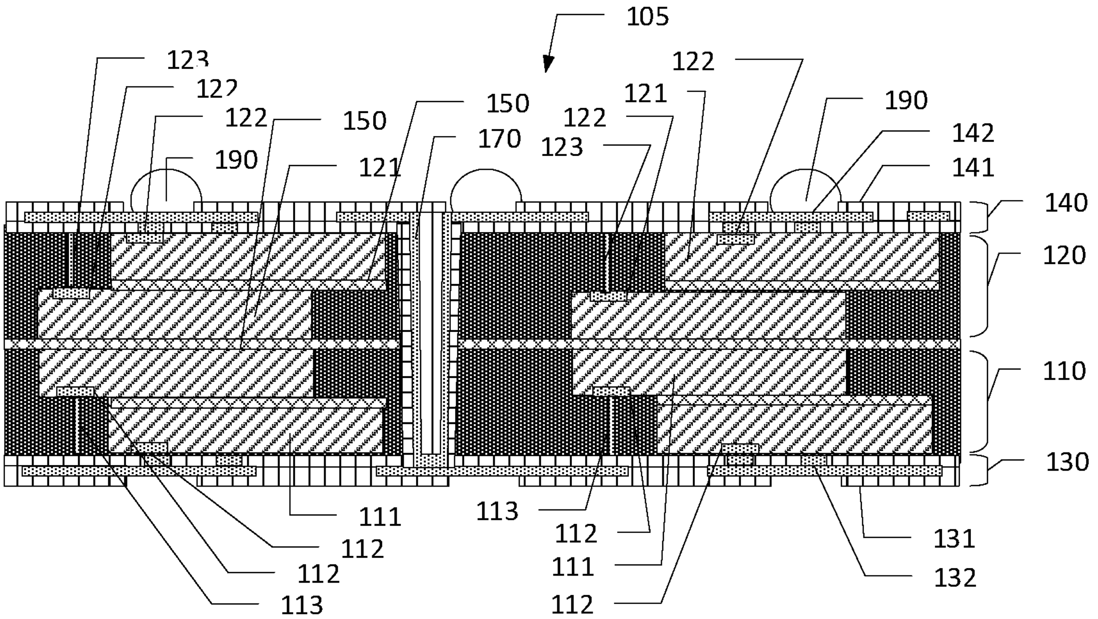

With further reference to FIGS. 1*e* and 1*f*, basic package modules of an integrated package device in accordance with some implementations of the present application are disclosed.

As shown in FIG. 1*e*, a package module 104 is illustrated as an integrated package device. Based on the package module 102 depicted in FIG. 1*c*, the package module 104 has additional external connection structures 190 that are on the side of the second re-distribution layer 140 away from the second sub-package module 120 and connected with the second re-distribution layer 140.

As shown in FIG. 1*f*, a package module 105 is also depicted as an integrated package device. Similar to the above-mentioned package module 104, the package module 105 also has additional external connection structures 190 that are on the side of the second re-distribution layer 140 away from the second sub-package module 120 and connected with the second re-distribution layer 140. However, the package module 105 is different from the package module 104 in the position of each TMV 170. In other words, in the package module 105, a plurality of first electronic devices 111 and a plurality of second electronic devices 121 are arranged respectively in at least two columns disposed in the lateral direction perpendicular to the direction in which the first sub-package module 110 and the second sub-package module 120 are stacked. Here, the TMV 170 is not disposed on the outer side of one column of electronic devices away from the other column but between two columns of electronic devices, and there may be at least one TMV 170.

In some implementations, the external connection structure 190 may include, but is not limited to, an array of tin balls and may also include, e.g., tin paste, conductive glue, or bonding contacts. The tin balls are disposed in a plurality of openings (not labeled) that are in the above-mentioned insulating layer(s) 141 and face outside, and electrically connected with the exposed portions of the conductive layer 142. Using the tin balls of the external connection structure 190 as signal input/output terminals, the signals from an external device may be input into the package module 104/105 and the signals from the package module 104/105 may be output to the external device.

Furthermore, still referring to FIGS. 1*e* and 1*f*, although the external connection structure 190 is depicted on the side of the second re-distribution layer 140 away from the second sub-package module 120 and connected with the second re-distribution layer 140, it should be understood that the depiction is only for convenience of illustration. However, it is understood that an external connection structure 190 may be located on the side of the first re-distribution layer 130 away from the first sub-package module 110 and connected with the first re-distribution layer 130 without departing from the scope of the present disclosure. Therefore, it should be appreciated that the term "first" or "second" herein implies no meaning of "upper" or "lower" and can be exchangeable without departing from the scope of the present application as long as a relative relationship is met.

Using the package module 104/105 with the additional external connection structure 190 in the integrated package device disclosed in implementations of the present application, a plurality of package modules can be stacked and their external connections can be achieved by directly using the package module 104/105 as a unit. However, it should be understood that even though there is only the structure of the above-mentioned package module 102/103, a plurality of package modules may be stacked and externally connected. This is at least since the external connection structure 190 is a component that may be added when apparatus mounting is performed or a plurality of package modules are stacked by a downstream manufacturer. Therefore, the integrated package device disclosed herein may be or include any one of the above-described package modules 100, 101, 102, 103, 104 and 105.

In accordance with implementations of the present application, various integrated package devices that can be obtained using various stacking combinations utilizing any of the above-described various package modules 100, 101, 102, 103, 104 and 105. In other words, based on the package module 100, 101, 102, 103, 104, 105, the integrated package device disclosed by implementations of the present application may include one or more package modules.

Figure 2A:
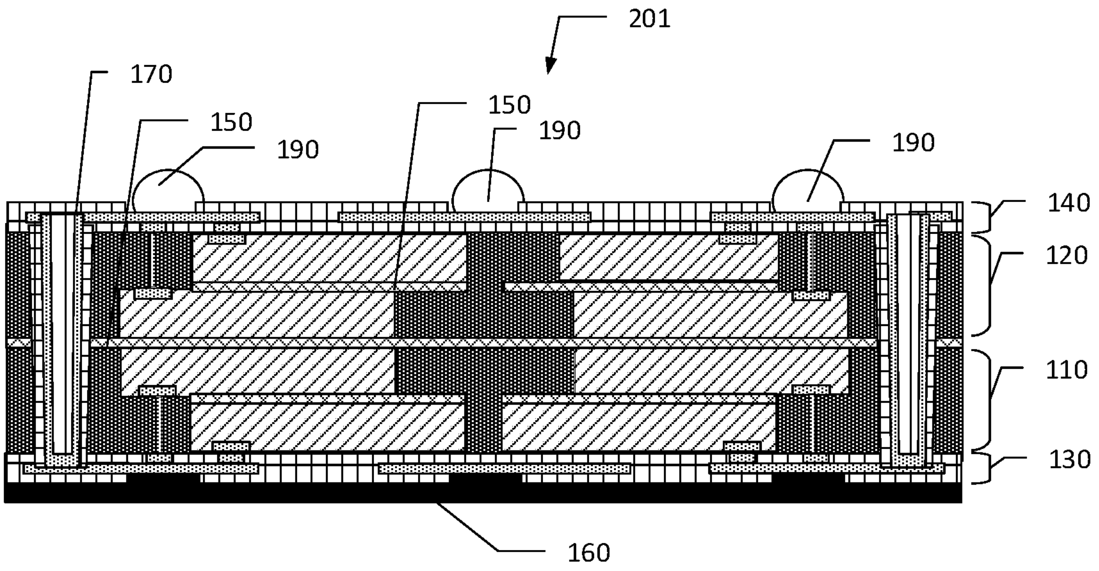
FIGS. 2*a*-2*d* are cross-sectional structure diagrams of various combinations of stacked package modules in an integrated package device provided by implementations of the present application and in particular

For example, referring to FIG. 2*a*, an implementation is illustrated in which an integrated package device disclosed by the present application is made of one package module. As shown in FIG. 2*a*, the integrated package device 201 includes the package module 105 (e.g., depicted in FIG. 1*e*) and a protecting layer 160 covering the first re-distribution layer 130 on the side away from the first sub-package module 110.

In some implementations, the material of the protecting layer 160 may be the same as that of the above-mentioned first/second molding body 118/128, and may include epoxy resin and/or any other suitable molding compound, e.g., such as epoxy resin, phenolic resin, a catalytic agent, a micro-powder of silicon dioxide, etc. The protecting layer 160 may protect the first re-distribution layer 130 from being damaged physically and/or chemically by, for example, oxidization and moisture.

In the integrated package device 201 depicted in FIG. 2*a*, as a vertical stack packaging scheme is employed, the following effects can also be achieved: accommodating a high number of semiconductor dies or devices, increasing the packaging density, and the package body having an electromagnetic shielding. The whole package body has a high proportion of metal, and dies are disposed back-to-back and have thermally conductive adhesive/bonding films therebetween to enable better effect of heat dissipation for the whole structure.

Figure 2B:
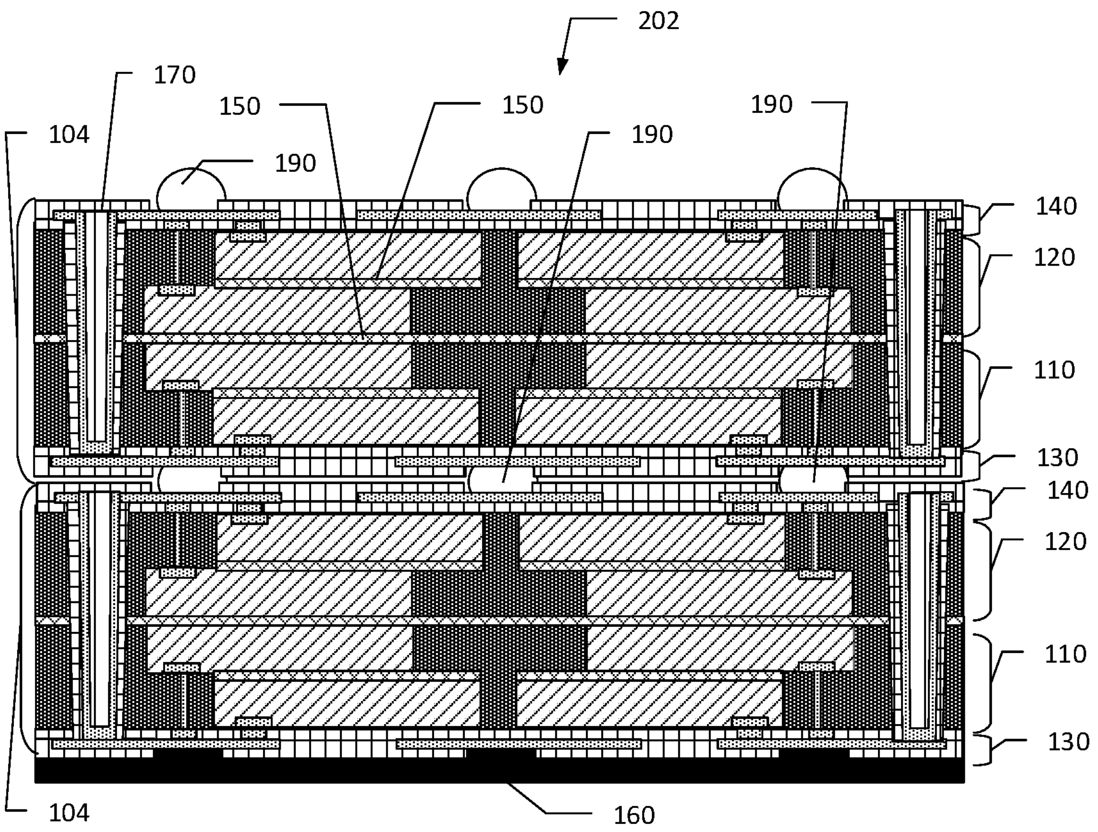

As shown in FIG. 2*b*, an implementation is illustrated in which an integrated package device disclosed by implementations of the present application is made of two package modules.

Referring to FIG. 2*b*, the integrated package device may include multiple instances of the package modules. The multiple package modules can be stacked in the direction in which the first sub-package module and the second sub-package module are stacked. The external connection structure on one of any two adjacent package modules may be connected with the first re-distribution layer of the other of the two adjacent package modules. The integrated package device may further include a protecting layer covering the first re-distribution layer of the package module outermost in the vertical direction.

Still referring to FIG. 2*b*, the integrated package device 202 may include two package modules 104 (each as shown in FIG. 1*e*) stacked one on top of the other in the direction in which the first sub-package module 110 and the second sub-package module 120 are stacked. The tin balls 190 (external connection structure) of the lower package module 104 act as members connected with the first re-distribution layer 130 in the upper package module 104. The integrated package device 202 further includes a protecting layer 160, which covers the first re-distribution layer 130 of the package module 104 outermost in the vertical direction (e.g., located at the bottom surface of the lower package module 104).

Using the integrated package device 202 as shown in FIG. 2*b*, the difficulty of processing ultra-thin chips/dies for a high stack package having a high capacity may be reduced to facilitate mass production and packages of different capacities may be processed flexibly due to the infinite possibilities of stacking to meet the market demands and beneficially improve the processing yield of packages.

Figure 2C:
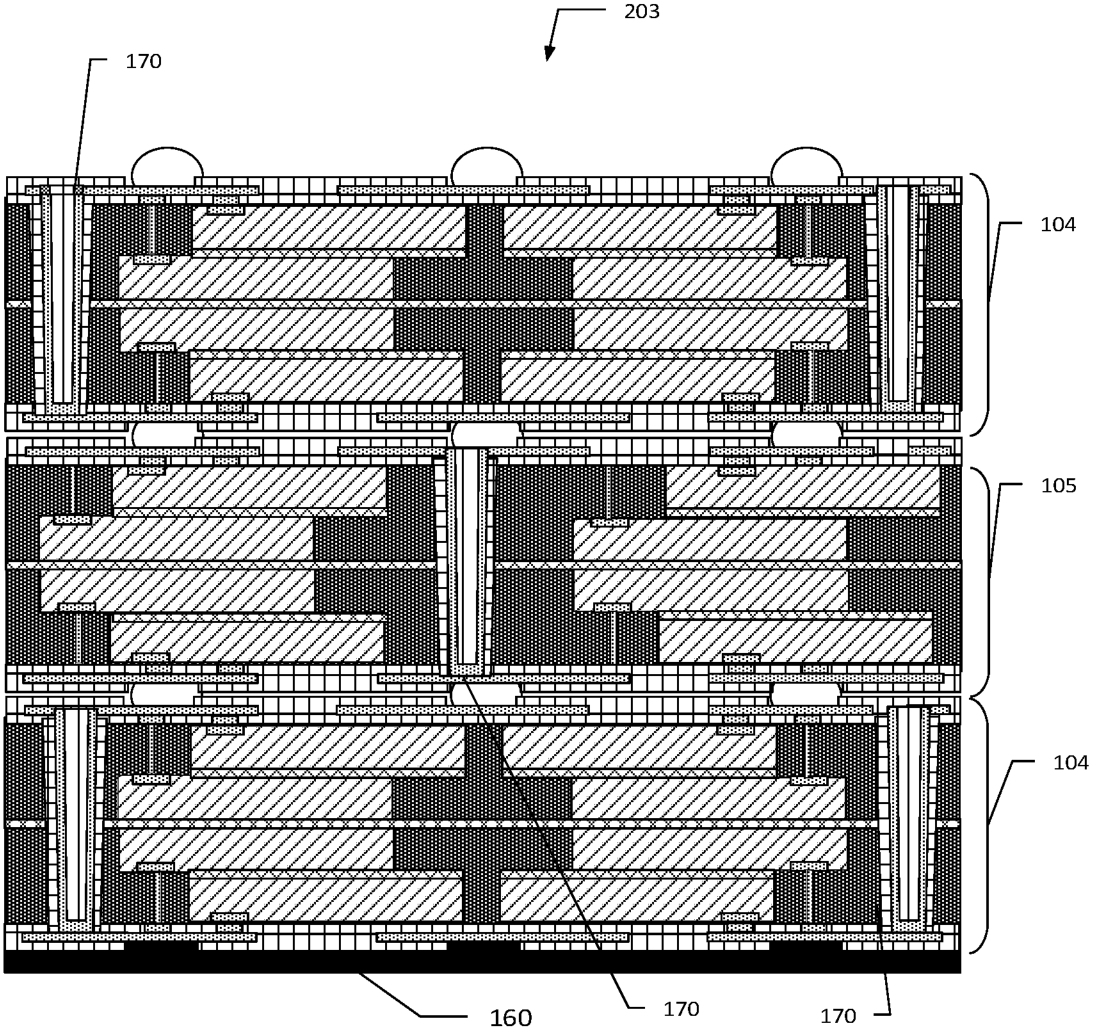

Referring to FIG. 2*c*, an integrated package device that includes multiple package modules (e.g., three package modules) is shown. The multiple package modules can be stacked in the direction in which the first sub-package module and the second sub-package module are stacked. The external connection structure on one of any two adjacent package modules may be connected with the first re-distribution layer of the other of the two adjacent package modules. The integrated package device may further include a protecting layer covering the first re-distribution layer of the package module outermost in the vertical direction. The TMVs of the multiple package modules are aligned or misaligned in the vertical direction.

The integrated package device 203 depicted in FIG. 2*c* may include two package modules 104 (each as shown in FIG. 1*e*) stacked one over the other vertically and one package module 105 sandwiched therebetween. In other words, the three package modules may be stacked one on top of another in the direction in which the first sub-package module 110 and the second sub-package module 120 of any of the package modules are stacked. The tin balls 190 (external connection structure) on the lower package module 104 act as members connected with the first re-distribution layer 130 in the package module 105. The tin balls 190 on the package module 105 may act as members connected with the first re-distribution layer 130 in the package module 104. The integrated package device 203 further includes a protecting layer 160 covering the first re-distribution layer 130 of the package module 104 outermost in the vertical direction (e.g., located at the bottom surface of the lowermost package module 104). Furthermore, the TMVs 170 of the package modules are aligned or misaligned in the vertical direction. In other words, the TMVs 170 in each package module 104 and the TMVs 170 in the package module 105 are misaligned, while the TMVs 170 in the uppermost package module 104 and the TMVs 170 in the lowermost package module 104 are aligned.

The integrated package device 203 as shown in FIG. 2*c* may achieve the same effects as the integrated package device 202 as shown in FIG. 2*b*. Moreover, although not shown in the figures, it can be appreciated, from the illustration of the integrated package devices 202 and 203, that any number of instances of the package modules 100, 101, 102, 103 and 104 can be used in any combination and arrangement. For example, four or even five package modules can be stacked one on top of another. The electronic devices can also be used in any combination as described previously, for example, each vertical column may include one, two, three or four electronic devices, which means no limitation.

Some implementations of the present application further provide a memory system including an integrated package device using any of the previously described combinations. In the memory system, at least one of the first electronic devices and/or at least one of the second electronic devices of the integrated package device include a memory device and at least any other one of the first electronic devices and/or at least any other one of the second electronic devices include a controller used to control operations of the memory device.

Figure 2D:
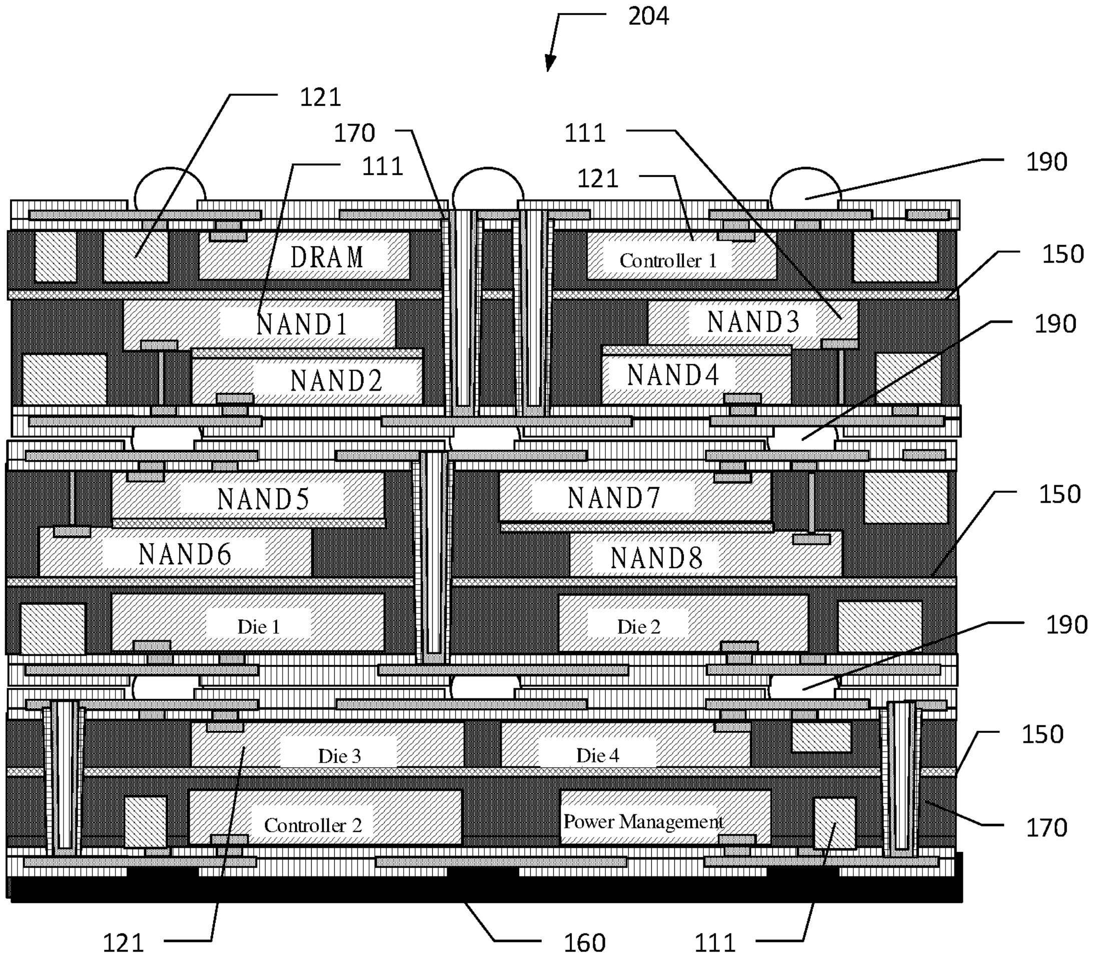

As shown in FIG. 2*d*, an integrated package device 204 as a memory system is illustrated. In FIG. 2*d*, electronic devices are represented respectively by boxes with the names of corresponding devices therein and corresponding reference numbers are omitted. For example, the electronic devices represented by the boxes include a DRAM, a controller 1, NANDs 1 to 8, dies 1 to 4, a controller 2, a power management die and the like. With reference to the positions corresponding to the first electronic devices in the lower first sub-package module and the second electronic devices in the upper second sub-package module of each package module, the first electronic devices 111 in the integrated package device 204 may include NANDs 1 to 4, dies 1 to 2, a controller 2, and a power management die. On the other hand, the second electronic devices 121 may include a DRAM, a controller 1, NANDs 5 to 8 and dies 3 to 4. The memory system may include a memory and a controller that are electrically connected. The controller may be used for controlling data storage of the memory. The memory and the controller may be those well known to the skilled persons in the art and will not be detailed here. The memory system may be applied in a computer, a television, a set top box, a vehicle-mounted terminal product, or the like.

Still referring to FIG. 2*d*, the integrated package device 204 may act as a memory system; and at least one of the first electronic devices and/or at least one of the second electronic devices in the integrated package device include a memory device and at least any other one of the first electronic devices and/or at least any other one of the second electronic devices include a controller used to control operations of the memory device.

Figure 3:
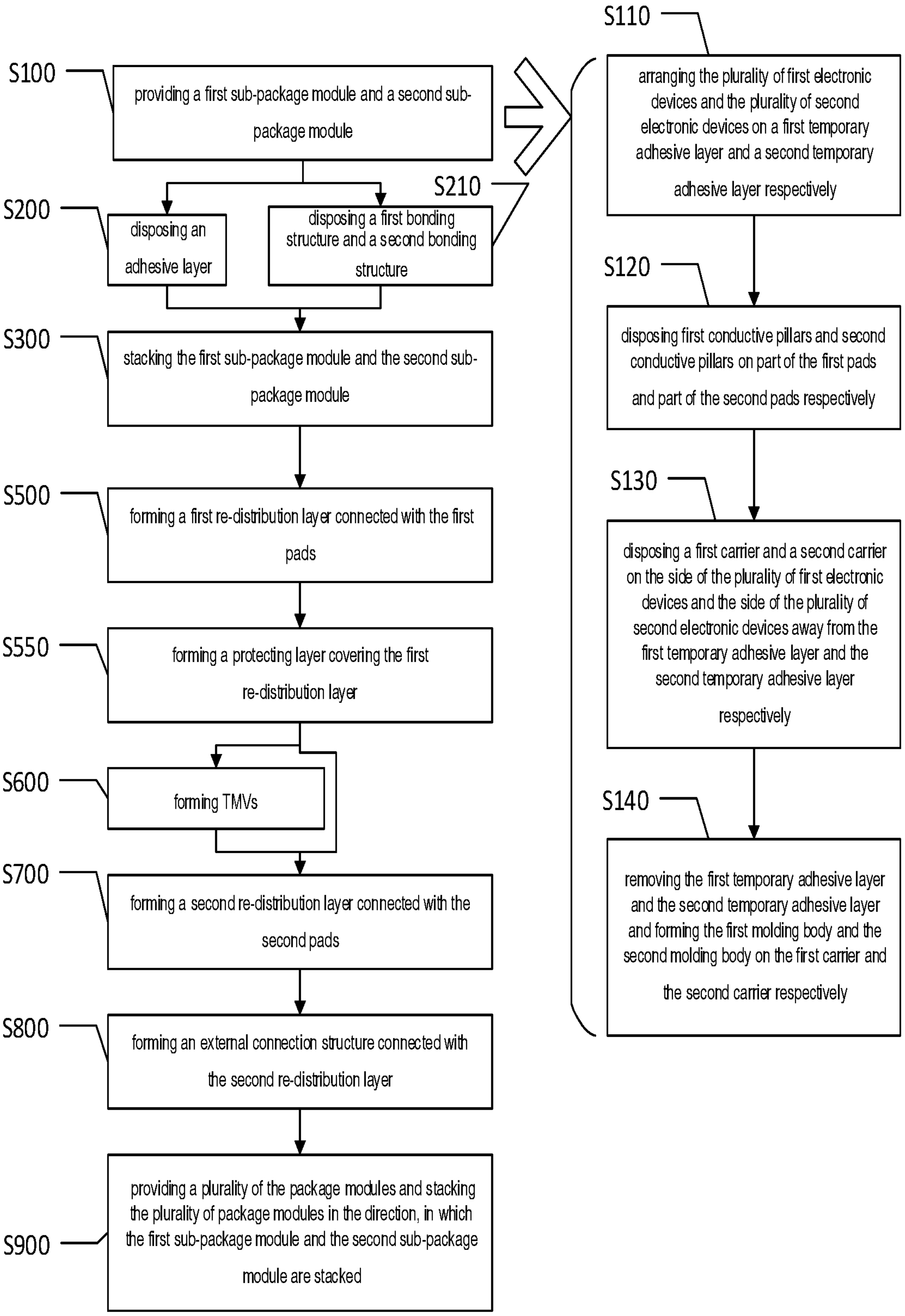
FIG. 3 is a flow chart of a method of fabricating an integrated package device provided in an implementation of the present application.

The integrated package devices in accordance with some implementations of the present application have been described above and in accordance with some other implementations of the present application a method of fabricating the integrated package device as described above is further provided. As shown in FIG. 3, the method of fabricating an integrated package device in accordance with some implementations of the present application may include the following operations.

Referring to FIG. 3, at operation S100, a first sub-package module and a second sub-package module are provided. The first sub-package module includes a plurality of first electronic devices and a first molding body may encapsulate the plurality of first electronic devices. Each of the first electronic devices may include a first pad on a side thereof. The second sub-package module may be on the side of the first sub-package module away from the first pad. The second sub-package module may include a plurality of second electronic devices and a second molding body that encapsulates the plurality of second electronic devices. Each of the second electronic devices may include a second pad on a side thereof.

At operation S300, the first sub-package module and the second sub-package module are stacked.

At operation S500, a first re-distribution layer is formed on the side of the first sub-package module away from the second sub-package module and connected with the first pads.

At operation S700, a second re-distribution layer is formed on the side of the second sub-package module away from the first sub-package module and connected with the second pads.

Referring again to operation S100, the first sub-package module and the second sub-package module can be provided in many ways, one of which will be taken as a representative and may further include the following sub-steps.

For instance, at operation S110, the plurality of first electronic devices and the plurality of second electronic devices are arranged on a first temporary adhesive layer and a second adhesive layer respectively with the first pads of the first electronic devices and the second pads of the second electronic devices facing one and the same side respectively.

At operation S120, first conductive pillars and second conductive pillars are disposed on part of the first pads and part of the second pads respectively.

At operation S130, a first carrier and a second carrier are disposed on the side of the plurality of first electronic devices and the side of the plurality of second electronic devices away from the first temporary adhesive layer and the second temporary adhesive layer respectively and have temporary bonding films facing the plurality of first electronic devices and the plurality of second electronic devices respectively with the first pads and the second pads facing the first carrier and the second carrier or facing away from the first carrier and the second carrier respectively.

At operation S140, the first temporary adhesive layer and the second temporary adhesive layer are removed respectively, and the first molding body and the second molding body are formed on the first carrier and the second carrier respectively.

Referring again to operation S300, the first sub-package module and the second sub-package module can be stacked in many ways, one of which will be taken as a representative. That is to say, operation S300 may further include: positioning the first carrier and the second carrier on two sides of the combination of the first molding body and the second molding body; and removing the first carrier and the second carrier before forming the first re-distribution layer and the second re-distribution layer.

Likewise, between operation S100 and operation S300, various operations may be added depending on the chosen structure of the integrated package device and two of the operations are taken as a representative.

For instance, at operation S200, an adhesive layer may be disposed between the first sub-package module and the second sub-package module. At operation S210, a first bonding structure and a second bonding structure may be disposed on the first sub-package module and the second sub-package module respectively.

Furthermore, after forming the first re-distribution layer in operation S500 and before performing operation S700, many operations may be added depending on the chosen structure of the integrated package device. For instance, operation S550 may be optionally added, which includes forming a protecting layer on the side the first re-distribution layer away from the first sub-package module to cover the first re-distribution layer.

Furthermore, with reference to the integrated package device having TMVs depicted in FIG. 1*c*, the method of fabricating an integrated package device may further include the following optional steps within operation S700 when the second re-distribution layer is formed.

For instance, at operation S600, TMVs are formed to extend through the first molding body and the second molding body and to be connected with the first re-distribution layer and the second re-distribution layer; and the second re-distribution layer is connected with the TMVs.

Furthermore, the method of fabricating an integrated package device may include applying the completed basic package module.

For instance, at operation S800, an external connection structure is formed on the side of the second re-distribution layer away from the second sub-package module and connected with the second re-distribution layer.

At operation S900, a plurality of package modules are provided and stacked in the direction in which the first sub-package module and the second sub-package module are stacked. The external connection structure on one of any two adjacent package modules may be connected with the first re-distribution layer of the other of the two adjacent package modules.

Operations corresponding to various possible operations in the method of fabricating an integrated package device will be detailed with reference to the cross-sectional structural diagrams in FIGS. 4*a* to 4*j*.

Figure 4A:
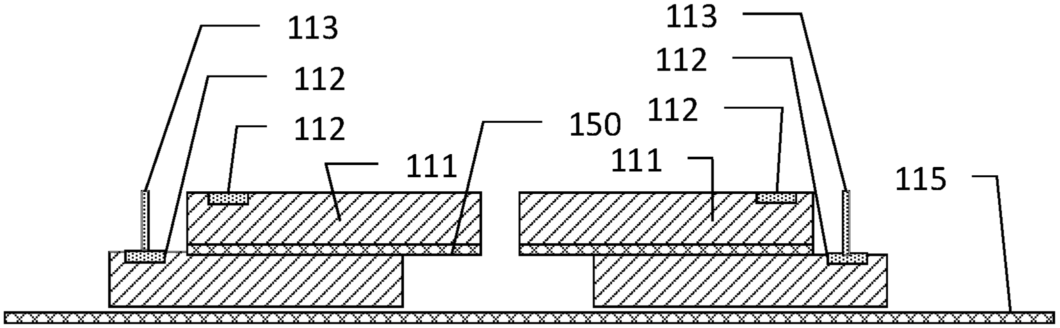
FIGS. 4*a*-4*j* are cross-sectional structure diagrams corresponding to the main steps of fabricating a package module in a method of fabricating an integrated package device provided in an implementation of the present application.
Figure 4B:
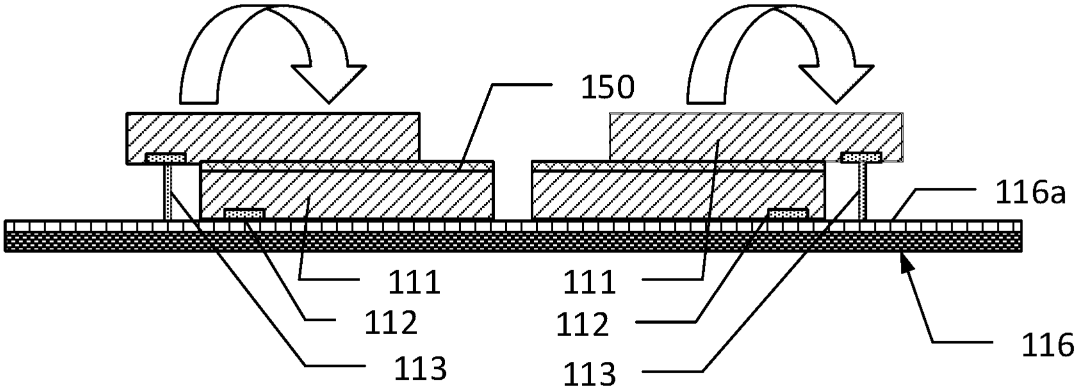
Figure 4C:
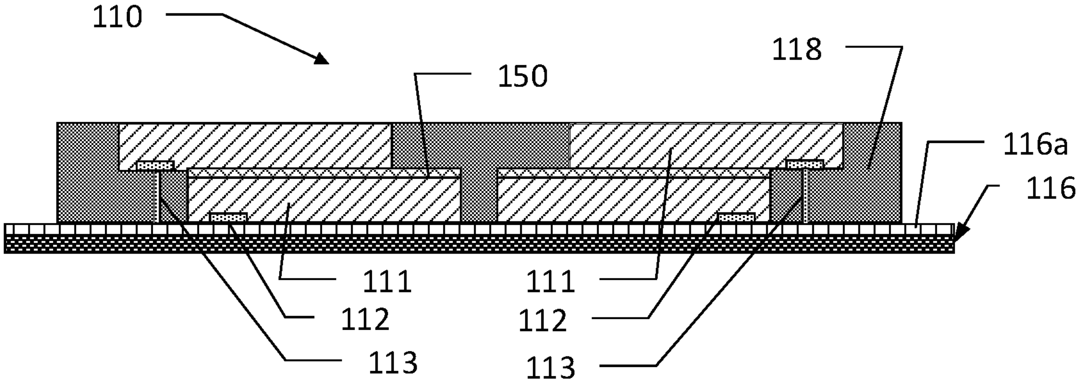

For instance, with reference to FIGS. 4*a* to 4*c*, operation S100 in FIG. 3 is performed, e.g., a first sub-package module and a second sub-package module are provided. The first sub-package module includes a plurality of first electronic devices and a first molding body encapsulating the plurality of first electronic devices, each of the first electronic devices may include a first pad on a side thereof. The second sub-package module is on the side of the first sub-package module away from the first pad and includes a plurality of second electronic devices and a second molding body encapsulating the plurality of second electronic devices, each of the second electronic devices including a second pad on a side thereof.

In some implementations, the first sub-package module and the second sub-package module may have combinations of the same electronic devices or different electronic devices as shown in FIGS. 1*a* and 1*b*, but may be fabricated using essentially the same method. Therefore, in the following description, the combination as shown in FIG. 1*a* may be taken as a representative for illustration and only the first sub-package module 110 will be described as a representative with the description of the devices of the second sub-package module affixed in parentheses unless it is necessary to describe the second sub-package module 120 at the same time.

For instance, operation S100 may include sub-operations S110 to S140. As shown in FIG. 4*a*, operation S110 in FIG. 3 is performed, e.g., the plurality of first electronic devices 111 (and the plurality of second electronic devices) are firstly arranged on a first temporary adhesive layer 115 (and a second temporary adhesive layer) respectively with the first pads 112 on the first electronic devices 111 (and the second pads on the second electronic devices) facing the same side respectively. The plurality of first electronic devices 111 stacked vertically may be fixed together with DAFs 150 or any suitable adhesive materials therebetween, which, however, means no limitation.

As shown in FIG. 4*a*, operation S120 is performed, e.g., first conductive pillars 113 (and second conductive pillars) protruding in the direction in which the first electronic devices 111 are stacked, are disposed respectively on part of the first pads 112 (and part of the second pads).

Herein, in accordance with the integrated package devices in some implementations of the present application as shown in FIGS. 1*a* and 1*b*, this operation is not limited to disposing conductive pillars and gold wires may be disposed depending on designs. Therefore, any devices for leading out of pads may be used. However, it can be appreciated that conductive pillars have the advantage of saving lateral space.

Subsequently, as shown in FIG. 4*b*, operation S130 of FIG. 3 is performed, e.g., a first carrier 116 (and a second carrier) is disposed respectively on the side of the plurality of first electronic devices 111 (and the plurality of second electronic devices) away from the first temporary adhesive layer 115 (and the second temporary adhesive layer) and has a temporary bonding film 116*a* facing respectively the plurality of first electronic devices (and the plurality of second electronic devices) with the first pads 112 (and the second pads respectively) facing the first carrier 116 (and the second carrier).

For instance, as shown in FIG. 4*b*, before the first electronic devices 111 are disposed on the first carrier 116, the stacked plurality of first electronic devices 111 may be inverted upside down and the first electronic device 111 not adhered to the first temporary adhesive layer 115 may be adhered to the temporary bonding film 116*a* of the first carrier 116. It is appreciated that whether or not to invert the first electronic devices 111 upside down can be determined depending on the manner in which the first pads 112 are connected with the temporary film 116*a*. For example, when connections are achieved through gold wires 113' as shown in FIG. 1*b*, it may not be necessary to invert the plurality of first electronic devices 111 upside down. Additionally and/or alternatively, the first carrier 116 may be attached to the side of the first electronic devices away from the first temporary adhesive layer 115 directly without the inversion, and then the inversion is done to move on to the next operation.

Subsequently, as shown in FIGS. 4*b* and 4*c*, operation S140 in FIG. 3 is performed. For example, the first temporary adhesive layer 115 (and the second temporary adhesive layer) is respectively removed and the first molding body 118 (and the second molding body) is respectively formed on the first carrier 116 (and the second carrier) to complete the first sub-package module 110 (and the second sub-package module). The material of the molding body has been described above and will not be repeated here.

After the first sub-package module and the second sub-package module are completed respectively using the sub-operations mentioned above, the above-mentioned operation S100 of providing the first sub-package module and the second sub-package module may be completed.

Subsequently, the above-mentioned main operation S300 of stacking the first sub-package module and the second sub-package module may be performed.

Figure 4D:
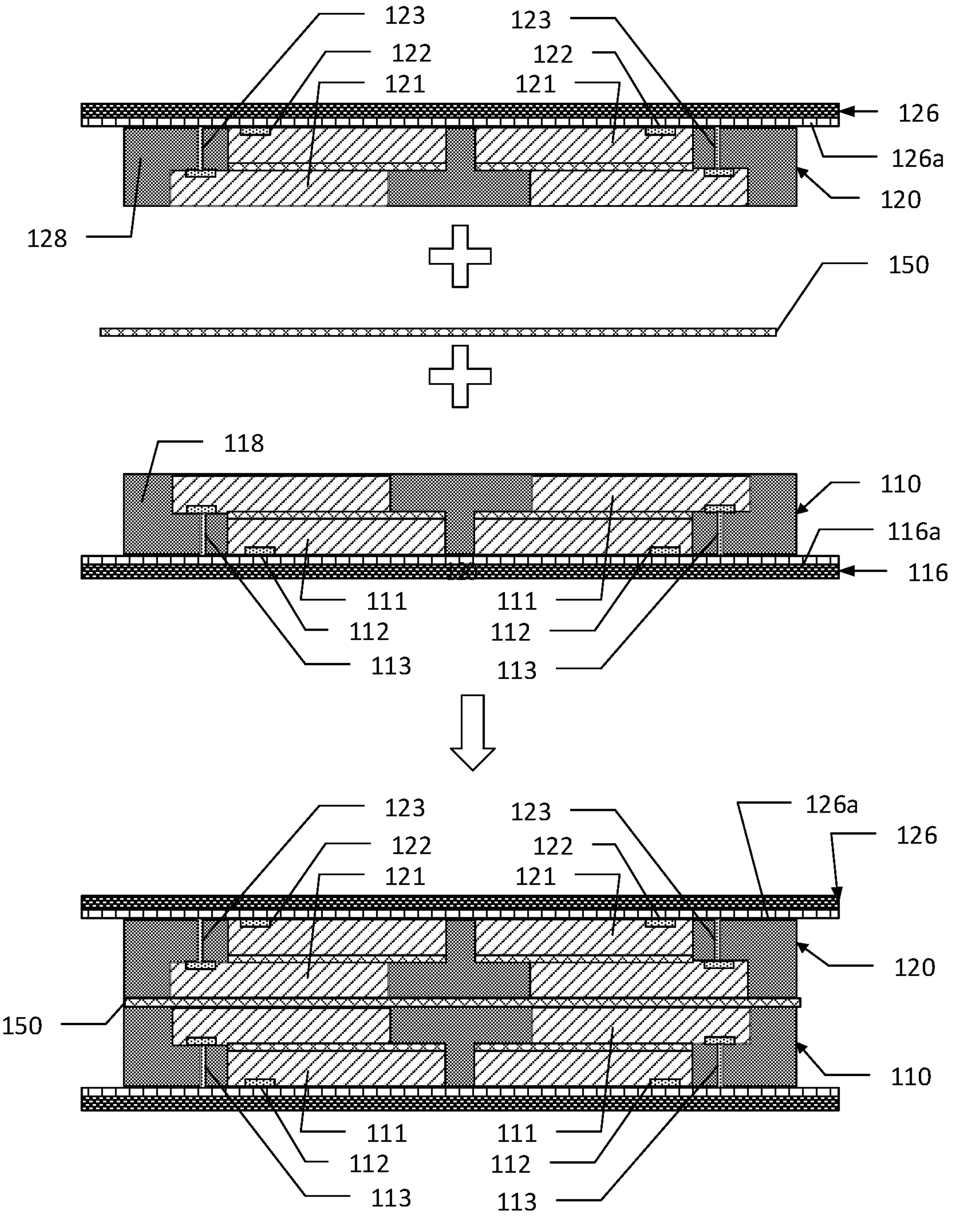

For instance, with reference to FIG. 4*d*, to stack the first sub-package module and the second sub-package module, the side of the first sub-package module 110 and the side of the second sub-package module 120 away from the first carrier 116 and the second carrier 126 respectively are placed close to each other with the first carrier 116 and the second carrier 126 located on the two outer sides of the combination of the first sub-package module 110 and the second sub-package module 120.

In accordance with some implementations of the present application, different alternative operations may be used to stack the first sub-package module and the second sub-package module depending on different structures of the integrated package device.

With respect to the first type of the steps, as shown in FIG. 4*d*, operation S200 in FIG. 3 is performed, e.g., a DAF 150 is disposed between the first sub-package module 110 and the second sub-package module 120 to join them together solidly from upside and downside respectively.

Figure 6A:
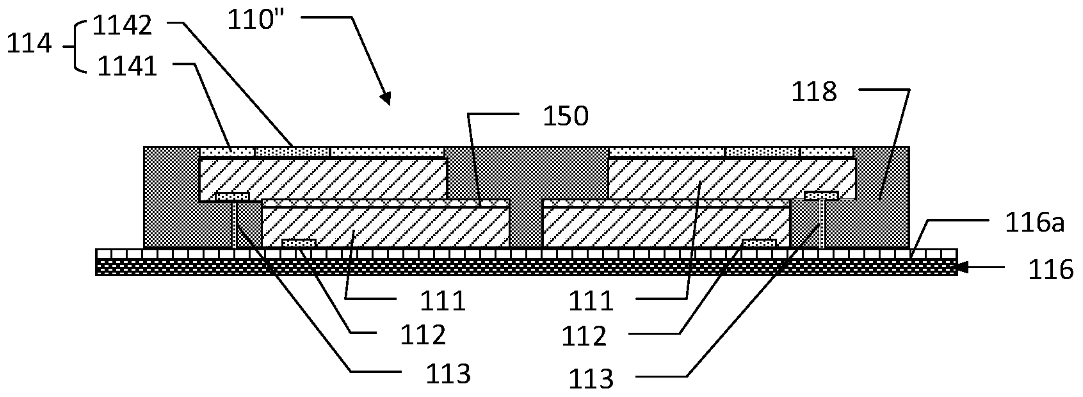
FIGS. 6*a* and 6*b* are cross-sectional structure diagrams illustrating a combination of sub-package modules in a method of fabricating an integrated package device in an implementation of the present application.
Figure 6B:
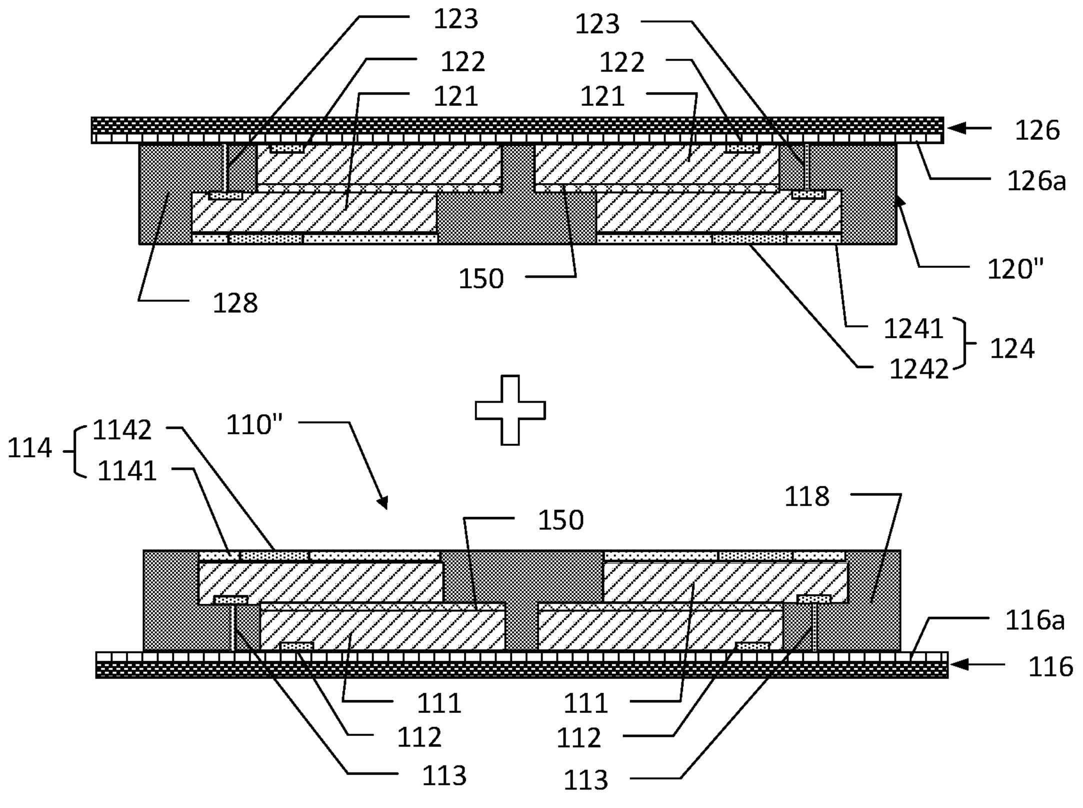

With respect to the second type of the steps, as shown in FIGS. 6*a* and 6*b*, operation S210 in FIG. 3 is performed, e.g., the first bonding structure 114 and the second bonding structure 124 are disposed on the bonding surfaces of the electronic devices on the bonding side of the first sub-package module 110" and the bonding side of the second sub-package module 120" respectively to bond the first sub-package module 110" and the second sub-package module 120" together and achieve conductive connections by joining the first bonding structure 114 and the second bonding structure 124 under heat or pressure. Various bonding techniques, without limitation, may be used for the bonding described herein.

After the first sub-package module and the second sub-package module are bonded together to form a combination, the main operation S500 is performed. At operation S500, the first re-distribution layer 130 is formed on the side of the first sub-package module 110 away from the second sub-package module 120 and connected with the first pads 112. However, before formation of the first re-distribution layer 130, the first carrier 116 is removed. Moreover, before subsequent formation of the second re-distribution layer 140, the second carrier 126 is also removed.

Figure 4E:
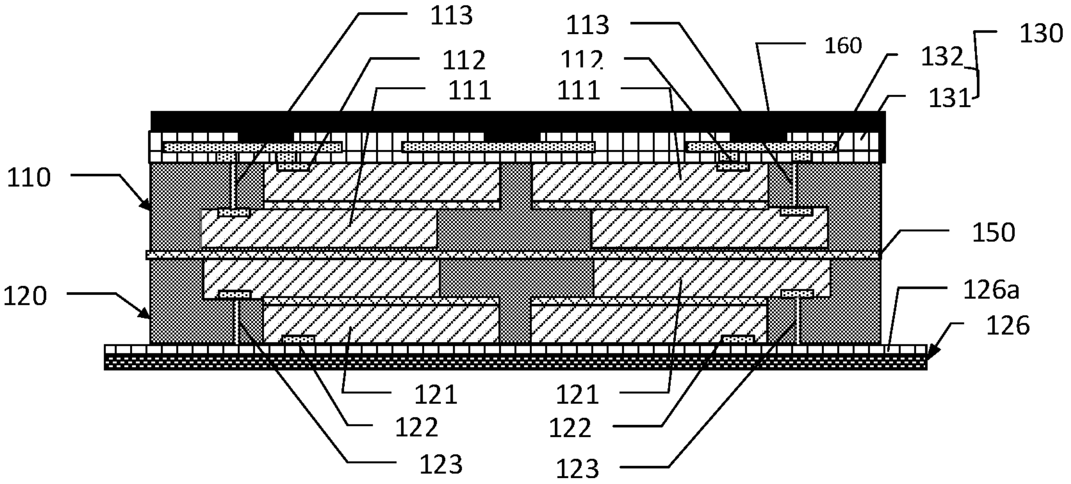
Figure 4F:
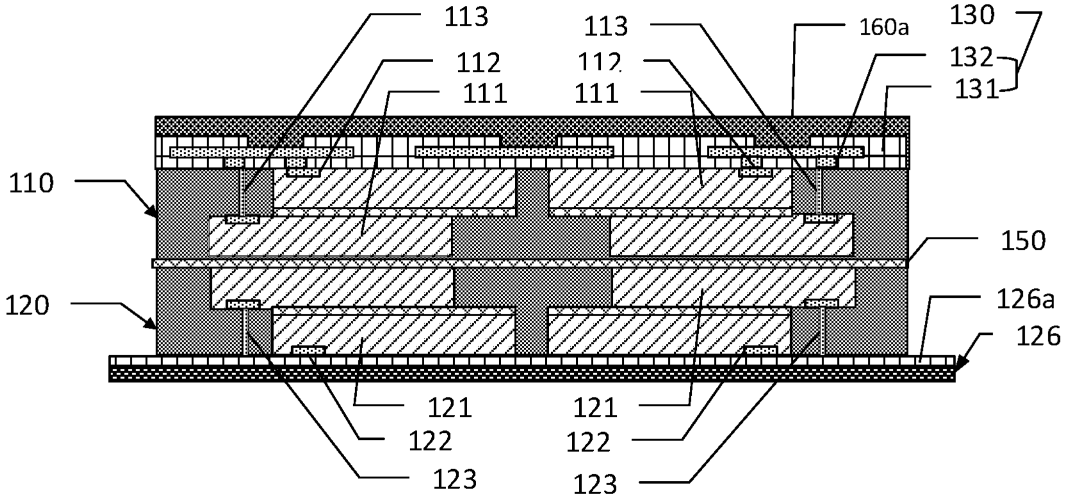

For instance, as shown in FIGS. 4*e* and 4*f*, operation S500 in FIG. 3 is performed. By way of example, the first carrier 116 is removed before formation of the first re-distribution layer 130 and then the first re-distribution layer 130 is formed at the location where the first carrier was before being removed. During formation of the first re-distribution layer 130, with reference to the description above, an insulating layer 131 is formed, then a conductive layer 132 is formed and then another insulating layer 131 is formed covering the conductive layer 132. Openings (not labeled) are formed at suitable positions for external connections. The conductive layer 132 may include metal, any other suitable conductive material or any combination thereof and the insulating layers 131 may include an organic or inorganic material, e.g., such as silicon oxide, silicon nitride, silicon oxynitride, any other suitable insulating material or any combination thereof. The number of the conductive layer(s) 132 and the number of the insulating layers 131 in the first re-distribution layer 130 may be determined. Depending on practical designs and for convenience, only one conductive layer 132 is shown, as one non-limiting example.

Still referring to FIGS. 4*e* and 4*f*, operation S550 in FIG. 3 is performed, e.g., a protecting layer 160/160*a* is formed on the side of the first re-distribution layer 130 away from the first sub-package module 110 to cover the first re-distribution layer 130.

FIG. 4*e* and FIG. 4*f* are different from each other in that FIG. 4*e* shows a protecting layer 160, while FIG. 4*f* shows a temporary protecting layer 160*a*. The protecting layer 160 and the temporary protecting layer 160*a* are collectively referred to as "protecting layers" and may be chosen for use depending on the subsequent application of the package module. In other words, if the first re-distribution layer 130 is outermost in the stack of package modules to be formed subsequently. As shown in FIG. 4*e*, the same material as that of the first molding body 118 may be used for the protecting layer, and the first re-distribution layer 130 is in middle of the stack of package modules. As shown in FIG. 4*f*, the temporary protective layer 160*a* may be selected such that is it easy to remove and has a material common in the art. By way of example and not limitation, any combination of polyimide, polybenzoxazole, phenol, and/or other resins/materials may be used as the temporary protective layer 160*a*. When a package module is to be arranged in a stack with other package modules, the temporary protecting layer 160*a* can be removed to facilitate electrical connections of the first re-distribution layer 130 with other devices. It can be appreciated that the formation of the temporary protecting layer 160*a* may be an optional operation.

Subsequently, operation S700 may be performed, the second re-distribution layer is formed on the side of the second sub-package module away from the first sub-package module and connected with the second pads.

Figure 4G:
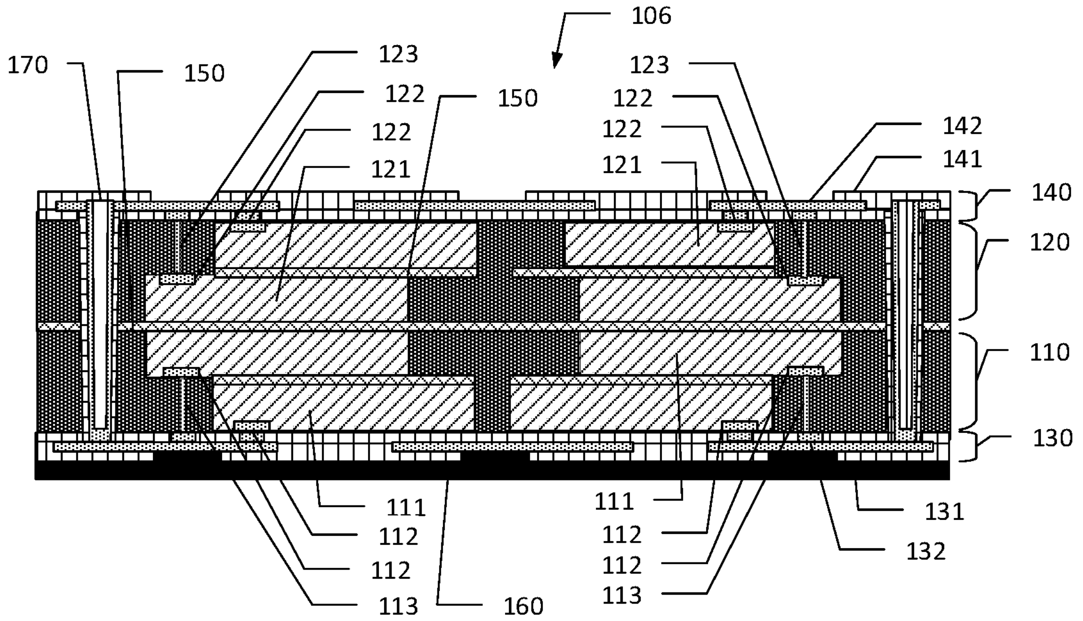
Figure 4H:
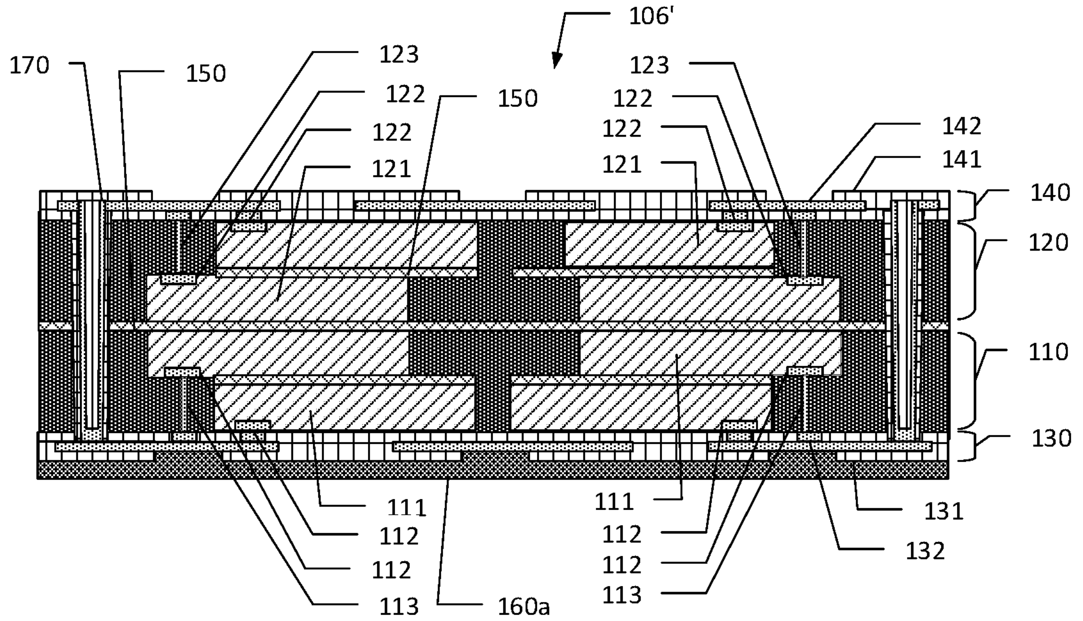

Referring to FIGS. 4*g* and 4*h*, after formation of the first re-distribution layer 130, the combination of the first sub-package module 110 and the second sub-package module 120 is inverted upside down and the second re-distribution layer 140 is formed on the side of the second sub-package module 120 away from the first sub-package module 110 and connected with the second pads 122. To reduce the number of figures, the optional TMVs 170 with respect to operation S600 are also shown in FIGS. 4*g* and 4*h*. The difference between FIGS. 4*g* and 4*h* is the same as that between FIGS. 4*e* and 4*f*. In other words, the formation of protecting layers 160 and 160*a*. Likewise, before formation of the second re-distribution layer 140, the corresponding second carrier 126 is removed, and the second re-distribution layer 140 is formed at the location as the second carrier 126 before its removal. The manner and the material for forming the second re-distribution layer 140 may be similar to those for forming the first re-distribution layer 130, and will not be repeated here. So far, the basic unit of the integrated package device (e.g., one package module 106/106') has been completed.

It is noted that, for different designs, as an option, the TMVs 170 corresponding to operation S600 may be selectively formed at the same time as the second re-distribution layer 140. In other words, if the bonding structures 114/124 as previously shown in FIGS. 6*a* and 6*b* are formed, the TMVs 170 may be or not be implemented optionally, and even if no bonding structures are formed, the TMVs 170 may not necessarily disposed.

As shown in FIGS. 4*g* and 4*h*, before formation of two insulating layers 141, through molding openings (not labeled) are formed in the first sub-package module 110 and the second sub-package module 120 and, during formation of one insulating layer 141, the material of the insulating layer 141 is also filled into the through molding openings. Then, during formation of the conductive layer 142 and the subsequent overlying insulating layer 141 in the second re-distribution layer 140, the materials of the conductive layer 142 and the insulating layer 141 are also filled into the TMVs, so that the TMVs 170 are formed in coordination with the second re-distribution layer 140. The same as the insulating layer 131, the insulating layer 141 may be used to cover the conductive layer 142 and has openings (not labeled) that are disposed at suitable positions and used to dispose tin balls 190 for external connections.

Figure 4I:
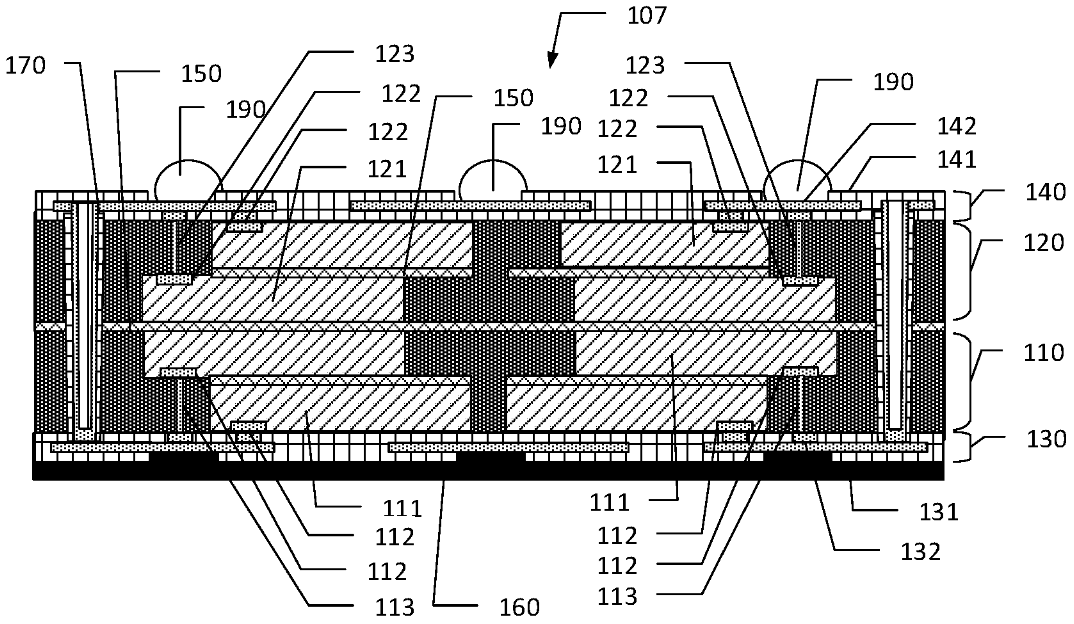
Figure 4J:
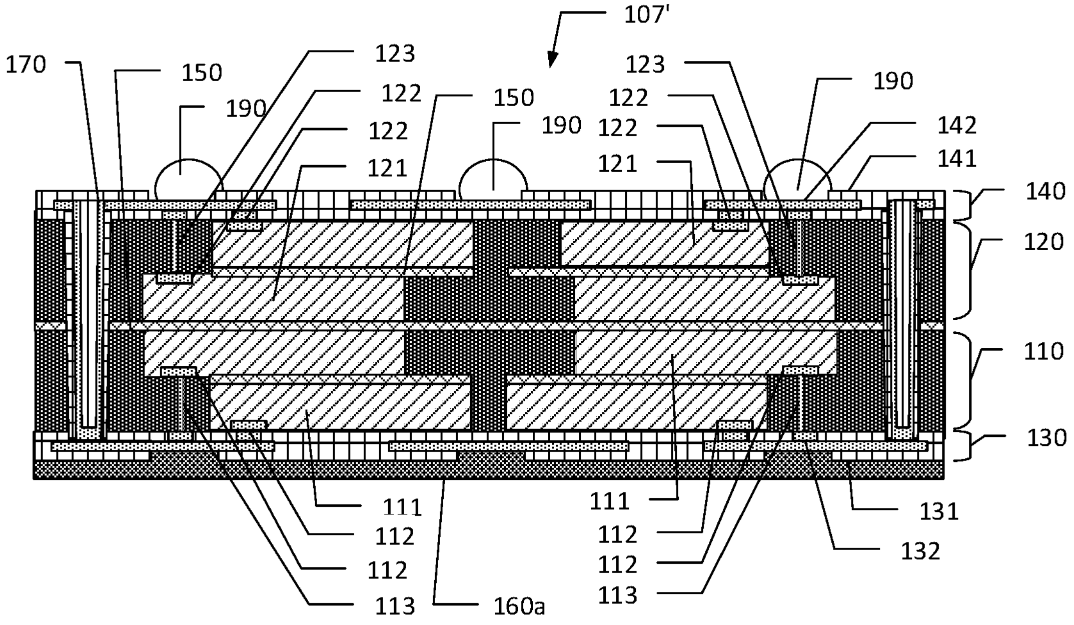

As shown in FIGS. 4*i* and 4*j*, after formation of the first re-distribution layer 130 and the second re-distribution layer 140, operation S800 is performed optionally. For example, an external connection structure is formed on the side of the second re-distribution layer 140 away from the second sub-package module and connected with the second re-distribution layer.

As shown in FIGS. 4*i* and 4*j*, the external connection structure 190 (e.g., the tin balls 190) are filled into the openings (not labeled) in the insulating layer 141 of the second re-distribution layer 140. This operation may be optional because the package module 106/106' completed at operation S700 may serve as an integrated package device alone. Furthermore, the tin balls may be added by the user when using the integrated package device (e.g., a single package module).

Hereafter, the method of fabricating an integrated package device including a plurality of package modules disclosed in implementations of the present application will be described. That is to say, operation S900 is performed. Here, a plurality of package modules are provided and stacked in the direction in which the first sub-package module and the second sub-package module are stacked; and the external connection structure on one of any two adjacent package modules is connected with the first re-distribution layer of the other of the two adjacent package modules.

Figure 5:
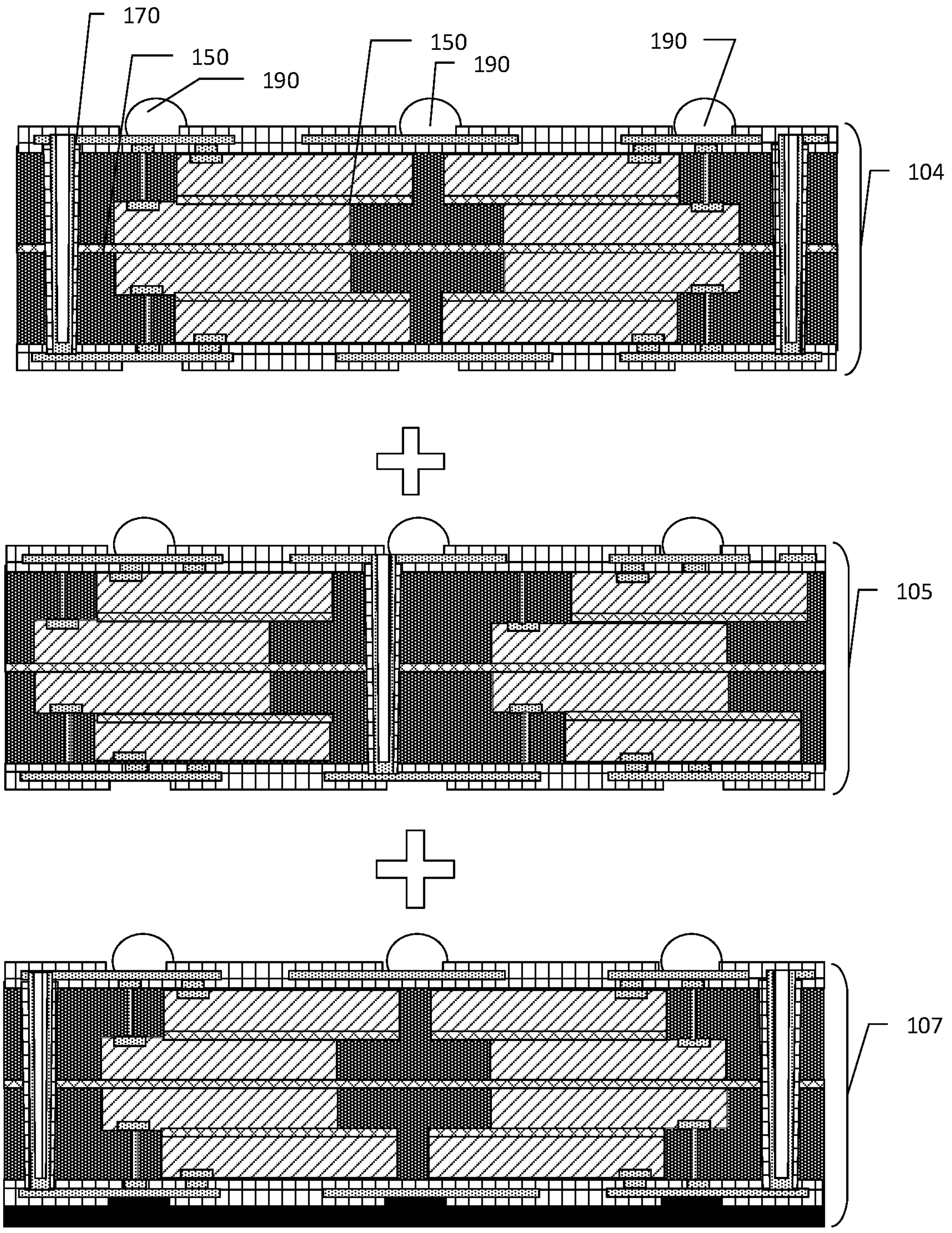
FIG. 5 is a representative cross-sectional structure diagram of a plurality of package modules during stacking in a method of fabricating an integrated package device in an implementation of the present application.

As shown in FIG. 5, operation S900 in FIG. 3 is performed. For example, package modules such as those represented by any of the package modules 104, 105 and 107 as shown in FIG. 1*e*, FIG. 1*f* and FIG. 4*i* respectively are stacked one on top of another and tin balls 190 are heated to melt and then flattened. In this way, the integrated package device 203 as shown in FIG. 2*c* may be obtained after reflow and curing.

Using the method of fabricating an integrated package device described above in some implementations of the present application, an integrated package device is provided that provides convenience and adapts to various system packages, especially those including memories. The integrated package device integrates chips of various functions, including a processor, a memory or any other functional chips, into one package to realize a substantially complete function and form an SiP. Furthermore, the difficulty of processing ultra-thin chips for a high stack package having a high capacity may be reduced to facilitate mass production and packages of different capacities may be processed flexibly due to the infinite possibilities of stacking, so as to meet the market demands and beneficially improve the processing yield of packages.

In summary, the integrated package device, the method of fabricating an integrated package device and the memory system in some implementations of the present application have been described above. However, the present application is not defined by those implementations. Alternations and modifications may be made to the implementations above by those skilled in the art to obtain other implementations without departing from the scope and spirit of the present application. All the technical solutions formed by identical or equivalent substitutions fall within the scope of the present application. Therefore, the scope of this application is defined by the claims.

What is claimed is:

1. An integrated package device, comprising:

at least one package module, comprising:

a first sub-package module comprising first electronic devices and a first molding body encapsulating the first electronic devices, and each of the first electronic devices including a first pad on a side thereof;

a second sub-package module stacked on a side of the first sub-package module away from the first pad and comprising second electronic devices and a second molding body encapsulating the second electronic devices, each of the second electronic devices including a second pad on a side thereof;

a first re-distribution layer located on a side of the first sub-package module away from the second sub-package module and connected with the first pads;

a second re-distribution layer located on a side of the second sub-package module away from the first sub-package module and connected with each of the second pads; and a through-molding via (TMV) extending through both the first molding body and the second molding body and connecting the first re-distribution layer and the second re-distribution layer, wherein the first electronic devices comprise:

a first set of NAND memory devices including a first NAND memory device stacked over a second NAND memory device and disposed in a first column of electronic devices; and a second set of NAND memory devices including a third NAND memory device stacked over a fourth NAND memory device and disposed in a second column of electronic devices laterally spaced from the first column in a direction perpendicular to a direction in which the first sub-package module and the second sub-package module are stacked.

2. The device of claim 1, further comprising:

a first bonding structure and a second bonding structure located between the first sub-package module and the second sub-package module and respectively on the first sub-package module and the second sub-package module, the first bonding structure and the second bonding structure bonding the first sub-package module and the second sub-package module together.

3. The device of claim 1, further comprising:
an external connection structure located on a side of the second re-distribution layer away from the second sub-package module and connected with the second re-distribution layer,
wherein the external connection structure comprises an array of tin balls.

4. The device of claim 1, wherein the at least one package module further comprises:
a protecting layer covering a side of the first re-distribution layer away from the first sub-package module.

5. The device of claim 1, wherein:
one or more of the first electronic devices or the second electronic devices are stacked, in staircase, respectively in a direction in which the first sub-package module and the second sub-package module are stacked, and
the first pad of each of the first electronic devices and the second pad of each of the second electronic devices are not covered by any other of the first electronic devices or any other of the second electronic devices.

6. The device of claim 1, wherein:
outer connecting surfaces of the first pads and outer connecting surfaces of the second pads face the first re-distribution layer and the second re-distribution layer respectively, and
one or more of the first sub-package module or the second sub-package module further respectively comprise one or more of first conductive pillars or second conductive pillars, which connect the first re-distribution layer with part of one or more of the first pads or the second re-distribution layer with part of the second pads respectively.

7. The device of claim 1, wherein:
outer connecting surfaces of the first pads face away from the first re-distribution layer or outer connecting surfaces of the second pads face away from the second re-distribution layer, and
the package module further comprises gold wires, through which the first pads are connected with the first re-distribution layer or the second pads are connected with the second re-distribution layer.

8. The device of claim 1, wherein:
the first electronic devices and the second electronic devices are arranged respectively in at least two columns of electronic devices in a lateral direction perpendicular to a direction in which the first sub-package module and the second sub-package module are stacked, and
the TMV is located on an outer side of one column of the electronic devices away from the other column.

9. The device of claim 1, wherein the first electronic devices and the second electronic devices are arranged respectively in at least two columns of the electronic devices in a lateral direction perpendicular to a direction in which the first sub-package module and the second sub-package module are stacked; and the TMV is located between the two columns of the electronic devices, and there is at least one TMV.

10. The device of claim 3, wherein:
the at least one package module comprising a plurality of the package modules,
the plurality of package modules are stacked in a direction in which the first sub-package module and the second sub-package module are stacked,
the external connection structure on one of any two adjacent package modules is connected with the first re-distribution layer of the other of the two adjacent package modules, and
the integrated package device further comprises a protecting layer covering the first re-distribution layer of the package module outermost in a vertical direction.

11. The device of claim 1, wherein:
the at least one package module further comprises an external connection structure located on a side of the second re-distribution layer away from the second electronic devices and connected with the second re-distribution layer,
the integrated package device further comprises a plurality of the package modules that are stacked in a direction in which the first sub-package module and the second sub-package module are stacked,
the external connection structure on one of any two adjacent package modules is connected with the first re-distribution layer of the other of the two adjacent package modules,
the integrated package device further comprises a protecting layer covering the first re-distribution layer of the package module outermost in a vertical direction, and
the TMVs in the package modules are aligned or misaligned in the vertical direction.

12. A memory system, comprising:
an integrated package device, comprising:
at least one package module, comprising:
a first sub-package module comprising a first electronic devices and a first molding body encapsulating the first electronic devices, and each of the first electronic devices including a first pad on a side thereof;
a second sub-package module stacked on a side of the first sub-package module away from the first pad and comprising a second electronic devices and a second molding body encapsulating the second electronic devices, each of the second electronic devices including a second pad on a side thereof;
a first re-distribution layer located on a side of the first sub-package module away from the second sub-package module and connected with the first pads;
a second re-distribution layer located on a side of the second sub-package module away from the first sub-package module and connected with each of the second pads; and
a through-molding via (TMV) extending through both the first molding body and the second molding body and connecting the first re-distribution layer and the second re-distribution layer,
wherein the first electronic devices comprise:
a first set of NAND memory devices including a first NAND memory device stacked over a second NAND memory device and disposed in a first column of electronic devices; and
a second set of NAND memory devices including a third NAND memory device stacked over a fourth NAND memory device and disposed in a second column of electronic devices laterally spaced from the first column in a direction perpendicular to a direction in which the first sub-package module and the second sub-package module are stacked; and
wherein one or more of at least one of the first electronic devices or at least one of the second electronic devices in the integrated package device comprise a memory device and at least any other one of the first electronic devices or at least any other one of the second electronic devices comprise a controller to control operations of the memory device.

13. The memory system of claim 12, wherein the second electronic devices comprise:

a controller arranged in the first column of electronic devices that includes the first set of NAND devices; and a dynamic random-access memory (DRAM) device or a power management device arranged in the second column of electronic devices that includes the second set of NAND device.

14. The memory system of claim 12, wherein the TMV is located between the first column of electronic devices and the second column of electronic devices.

15. The device of claim 1, wherein the second electronic devices comprise:

a controller arranged in the first column of electronic devices that includes the first set of NAND devices; and a dynamic random-access memory (DRAM) device or a power management device arranged in the second column of electronic devices that includes the second set of NAND device.

16. The device of claim 1, wherein the TMV is located between the first column of electronic devices and the second column of electronic devices.

17. The device of claim 1, wherein the TMV is located on an outer side of the first column of electronic devices away from the second column of electronic devices.

* * * * *